United States Patent
Lee et al.

(10) Patent No.: US 11,800,778 B2
(45) Date of Patent: Oct. 24, 2023

(54) INKJET SPRAYING METHOD IMPROVING FILM UNIFORMITY OF AN ORGANIC LAYER, INKJET SPRAYING DEVICE TO IMPROVE FILM UNIFORMITY OF AN ORGANIC LAYER AND DISPLAY PANEL MANUFACTURING METHOD USING SAME

(71) Applicant: Samsung Display Co., Ltd., Yongin-Si (KR)

(72) Inventors: Dongha Lee, Yongin-si (KR); Seoksoon Back, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 45 days.

(21) Appl. No.: 17/218,951

(22) Filed: Mar. 31, 2021

(65) Prior Publication Data

US 2022/0029096 A1  Jan. 27, 2022

(30) Foreign Application Priority Data

Jul. 24, 2020 (KR) .................. 10-2020-0092158

(51) Int. Cl.
*H10K 71/13* (2023.01)
*B05B 1/14* (2006.01)
*H10K 71/00* (2023.01)

(52) U.S. Cl.
CPC ............. *H10K 71/135* (2023.02); *B05B 1/14* (2013.01); *H10K 71/00* (2023.02)

(58) Field of Classification Search
CPC . H01L 51/0005; H01L 51/56; H01L 27/3211; H10K 71/135; H10K 71/00; H10K 59/35; B05B 1/14; B41J 2/00

See application file for complete search history.

(56) References Cited

U.S. PATENT DOCUMENTS 6,565,206 B2  5/2003  Okabe et al.
7,384,126 B2  6/2008  Nakamura et al.
(Continued)

FOREIGN PATENT DOCUMENTS

JP  4558685 B2  10/2010
JP  5436388 B2  3/2014
(Continued)

OTHER PUBLICATIONS

Madigan, et al., Advancements in Inkjet Printing for OLED Mass Production, Invited Paper, 30.2, SID 2014 Digest (Dec. 16, 2020), pp. 399-402.
(Continued)

*Primary Examiner* — Caleb E Henry
(74) *Attorney, Agent, or Firm* — CANTOR COLBURN LLP

(57) ABSTRACT

An inkjet spraying method includes preparing a spraying unit including nozzles for spraying an organic material on a target substrate including first pixels which display a same color, spraying the organic material to each of first pixels of a $(1+a \times n)$th first-pixel row in the first pixels, and spraying the organic material to each of first pixels of a $(2+a \times n)$th first-pixel row in the first pixels, where a first nozzle in the nozzles sprays the organic material to a first reference pixel in the first pixels of the $(1+a \times n)$th first-pixel row, a second nozzle, which is different from the first nozzle, in the nozzles sprays the organic material to a second reference pixel in the first pixels of the $(2+a \times n)$th first-pixel row, and the second reference pixel is disposed in parallel with the first reference pixel in a column direction.

20 Claims, 18 Drawing Sheets

(56) References Cited

U.S. PATENT DOCUMENTS

| | | |
|---|---|---|
| 7,616,286 B2 | 11/2009 | Kim |
| 7,851,020 B2 * | 12/2010 | Nagae .................. B41J 2/14233 |
| | | 427/256 |
| 7,902,085 B2 | 3/2011 | Chung et al. |
| 7,932,109 B2 | 4/2011 | Hayata et al. |
| 8,183,768 B2 | 5/2012 | Ko |
| 8,953,234 B2 | 2/2015 | Iguchi et al. |
| 9,082,732 B2 | 7/2015 | Goto |
| 9,203,027 B2 | 12/2015 | Suzuki |
| 2003/0081024 A1 | 5/2003 | Vives et al. |
| 2006/0039735 A1 * | 2/2006 | Oh ............................. B41J 3/28 |
| | | 400/320 |
| 2006/0176335 A1 * | 8/2006 | Chung .................. G02F 1/1303 |
| | | 347/40 |
| 2006/0279200 A1 * | 12/2006 | Nagae .................. B41J 2/14233 |
| | | 313/503 |
| 2007/0024185 A1 * | 2/2007 | Kitamura ............... H10K 71/00 |
| | | 427/66 |
| 2007/0190233 A1 | 8/2007 | Chung |
| 2007/0190252 A1 * | 8/2007 | Iwata ...................... B41M 5/00 |
| | | 427/258 |
| 2007/0222817 A1 | 9/2007 | Kurita et al. |
| 2007/0247480 A1 | 10/2007 | Kwon et al. |
| 2010/0009068 A1 | 1/2010 | Edwards et al. |
| 2014/0184683 A1 | 7/2014 | Harjee et al. |
| 2014/0198149 A1 * | 7/2014 | Kang ....................... B41J 11/06 |
| | | 347/19 |
| 2018/0257099 A1 * | 9/2018 | Miyazaki .......... H01L 21/67259 |
| 2020/0198327 A1 * | 6/2020 | Hauf .................. H01L 51/0031 |

FOREIGN PATENT DOCUMENTS

| | | |
|---|---|---|
| JP | 6142324 B2 | 6/2017 |
| JP | 6238133 B2 | 11/2017 |
| KR | 100233632 B1 | 12/1999 |
| KR | 100690520 B1 | 3/2007 |
| KR | 1020070104746 A | 10/2007 |
| KR | 100906171 B1 | 7/2009 |
| KR | 1020100118330 A | 11/2010 |
| KR | 101037037 B1 | 5/2011 |
| KR | 101119202 B1 | 3/2012 |
| KR | 1020160141127 A | 12/2016 |

OTHER PUBLICATIONS

Wu, et al., Development of 55 inch 4K AMOLED TV by Inkjet Printing Process, (Dec. 16, 2020), pp. 236-238.

* cited by examiner

INKJET SPRAYING METHOD IMPROVING FILM UNIFORMITY OF AN ORGANIC LAYER, INKJET SPRAYING DEVICE TO IMPROVE FILM UNIFORMITY OF AN ORGANIC LAYER AND DISPLAY PANEL MANUFACTURING METHOD USING SAME

This application claims priority to Korean Patent Application No. 10-2020-0092158, filed on Jul. 24, 2020, and all the benefits accruing therefrom under 35 U.S.C. § 119, the content of which in its entirety is herein incorporated by reference.

BACKGROUND

1. Field

Embodiments of the invention herein relate to an inkjet spraying method, an inkjet spraying device, and a display panel manufacturing method using the same, and more particularly, to an inkjet spraying method having improved reliability and product quality, an inkjet spraying device, and a display panel manufacturing method using the same.

2. Description of the Related Art

A display panel includes a plurality of pixels. The plurality of pixels each includes a driving element such as a transistor and a display element such as an organic light emitting diode. The display element may be formed by stacking an electrode and a light emitting pattern on a substrate.

This display element includes a plurality of organic films such as a color layer which produces a color. The plurality of organic films may be formed by a mask process including a deposition process, a light exposure process, a developing process, an etching process, etc. However, the mask process has a limitation in that the manufacturing process is complicated, thereby increasing manufacturing costs. Thus, studies on an inkjet spraying device and method which form the organic film in an inkjet spraying manner are being carried out recently.

SUMMARY

Embodiments of the invention provide an inkjet spraying device and an inkjet spraying method which may be used in a high resolution display panel manufacturing process and in which film uniformity of an organic layer to be manufactured may be improved.

Embodiments of the invention also provide a display panel manufacturing method having improved display quality by improving the film uniformity of an organic layer such as an emission layer to reduce stains that are visible from the outside.

An embodiment of the invention provides an inkjet spraying method including preparing a spraying unit including a plurality of nozzles for spraying an organic material on a target substrate including a plurality of first pixels which display a same color, spraying the organic material to each of first pixels of a $(1+a\times n)$th first-pixel row in the plurality of first pixels, and spraying the organic material to each of first pixels of a $(2+a\times n)$th first-pixel row in the plurality of first pixels, where a first nozzle in the plurality of nozzles sprays the organic material to a first reference pixel in the first pixels of the $(1+a\times n)$th first-pixel row, a second nozzle, which is different from the first nozzle, in the plurality of nozzles sprays the organic material to a second reference pixel in the first pixels of the $(2+a\times n)$th first-pixel row, the second reference pixel is disposed in parallel with the first reference pixel in a first direction, n is an integer of 2 or more, and a is an integer of 0 or more.

In an embodiment, the inkjet spraying method may further include shifting the spraying unit along a second direction of the plurality of first pixels which crosses the first direction after the spraying the organic material to each of the first pixels of the $(1+a\times n)$th first-pixel row in the plurality of first pixels and before the spraying the organic material to each of the first pixels of the $(2+a\times n)$th first-pixel row in the plurality of first pixels.

In an embodiment, the spraying the organic material to each of the first pixels of the $(2+a\times n)$th first-pixel row may be carried out after the spraying the organic material to each of the first pixels of the $(1+a\times n)$th first-pixel row.

In an embodiment, the spraying the organic material to each of the first pixels of the $(1+a\times n)$th first-pixel row in the plurality of first pixels may include spraying the organic material to each of first pixels of a first first-pixel row in the plurality of first pixels, and spraying the organic material to each of first pixels of a $(1+n)$th first-pixel row in the plurality of first pixels, where the first nozzle may spray the organic material to a first reference pixel in the first pixels of the first first-pixel row, and the first nozzle may spray the organic material to a first reference pixel in first pixels of a $(1+n)$th first-pixel row disposed in parallel with the first reference pixel in the first pixels of the first first-pixel row in the first direction.

In an embodiment, the spraying the organic material to each of the first pixels of the $(2+a\times n)$th first-pixel row in the plurality of first pixels may include spraying the organic material to each of first pixels of a second first-pixel row in the plurality of first pixels, and spraying the organic material to each of first pixels of a $(2+n)$th first-pixel row in the plurality of first pixels, where the second nozzle may spray the organic material to a second reference pixel in the first pixels of the second first-pixel row, the second nozzle may spray the organic material to a second reference pixel in first pixels of a $(2+n)$th first-pixel row, and the second reference pixel in the first pixels of the $(2+n)$th first-pixel row is disposed in parallel with the second reference pixel in the first pixels of the second first-pixel row.

In an embodiment, the organic material sprayed by each of the plurality of nozzles may include a same luminous material.

In an embodiment, the inkjet spraying method may further include moving the spraying unit along the first direction of the plurality of first pixels.

In an embodiment, the spraying unit may spray the organic material to the plurality of first pixels disposed in the second direction while moving along the first direction of the plurality of first pixels.

In an embodiment, the spraying unit may extend in the second direction.

In an embodiment, n may be an integer of 4 or more, and the inkjet spraying method, after the spraying the organic material to each of the first pixels of the $(2+a\times n)$th first-pixel row in the plurality of first pixels, may further include spraying the organic material to each of first pixels of a $(3+a\times n)$th first-pixel row in the plurality of first pixels and spraying the organic material to each of first pixels of a $(4+a\times n)$th first-pixel row in the plurality of first pixels.

In an embodiment, a third nozzle different from the first nozzle and the second nozzle in the plurality of nozzles may spray the organic material to a third reference pixel in the first pixels of the (3+a×n)th first-pixel row, the third reference pixel is disposed in parallel with the first reference pixel and the second reference pixel in the first direction, fourth nozzle different from the first nozzle to the third nozzle in the plurality of nozzles may spray the organic material to a fourth reference pixel in the first pixels of the (4+a×n)th first-pixel row, and the fourth reference pixel is disposed in parallel with the first reference pixel to the third reference pixel in the first direction.

In an embodiment, the target substrate may further include a plurality of second pixels arranged in a second direction which crosses the first direction and a plurality of third pixels arranged in the second direction.

In an embodiment, in the spraying the organic material, one to nine organic material drops may be sprayed to each of the plurality of first pixels.

In an embodiment of the invention, an inkjet spraying device includes a spraying unit including a plurality of nozzles which spray an organic material on a target substrate including a plurality of first pixels which display a same color, where the plurality of nozzles includes a first nozzle which sprays the organic material to a first reference pixel in first pixels disposed in a (1+a×n)th first-pixel row in the plurality of first pixels and a second nozzle which sprays the organic material to a second reference pixel in first pixels in a (2+a×n)th first-pixel row in the plurality of first pixels, the second reference pixel is disposed in parallel with the first reference pixel in a first direction, n is an integer of 2 or more, and a is an integer of 0 or more.

In an embodiment, the inkjet spraying device may further include a transfer part which moves the spraying unit along a second direction of the plurality of first pixels which crosses the first direction, and the spraying unit may spray the organic material to the plurality of first pixels disposed in the second direction while moving along the first direction.

In an embodiment of the invention, a display panel manufacturing method includes preparing a target substrate including a plurality of first pixels which display a same color, and forming an organic layer by spraying, through a spraying unit including a plurality of nozzles, an organic material to each of the plurality of first pixels, where in the forming the organic layer, a first nozzle in the plurality of nozzles sprays the organic material to a first reference pixel in first pixels of a (1+a×n)th first-pixel row in the plurality of first pixels, a second nozzle, which is different from the first nozzle, in the plurality of nozzles sprays the organic material to a second reference pixel in first pixels of a (2+a×n)th first-pixel row in the plurality of first pixels, the second reference pixel is disposed in parallel with the first reference pixel in a first direction, n is an integer of 2 or more, and a is an integer of 0 or more.

In an embodiment, the second nozzle may spray the organic material to a first same row pixel disposed in a same row as the first reference pixel in the spraying the organic material to the first pixels of the (1+a×n)th first-pixel row.

In an embodiment, n is an integer of 4 or more, in the forming the organic layer, a third nozzle different from the first nozzle and the second nozzle in the plurality of nozzles may spray the organic material to a third reference pixel in first pixels of a (3+a×n)th first-pixel row in the plurality of first pixels, the third reference pixel is disposed in parallel with the first reference pixel and the second reference pixel in the first direction, and a fourth nozzle different from the first nozzle to the third nozzle in the plurality of nozzles may spray the organic material to a fourth reference pixel in first pixels of a (4+a×n)th first-pixel row in the plurality of first pixels, the fourth reference pixel is disposed in parallel with the first reference pixel to the third reference pixel in the first direction.

In an embodiment, the target substrate may further include a pixel defining film which separates the plurality of first pixels.

In an embodiment, the organic material may include a luminous material, and be included in a light emitting element.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
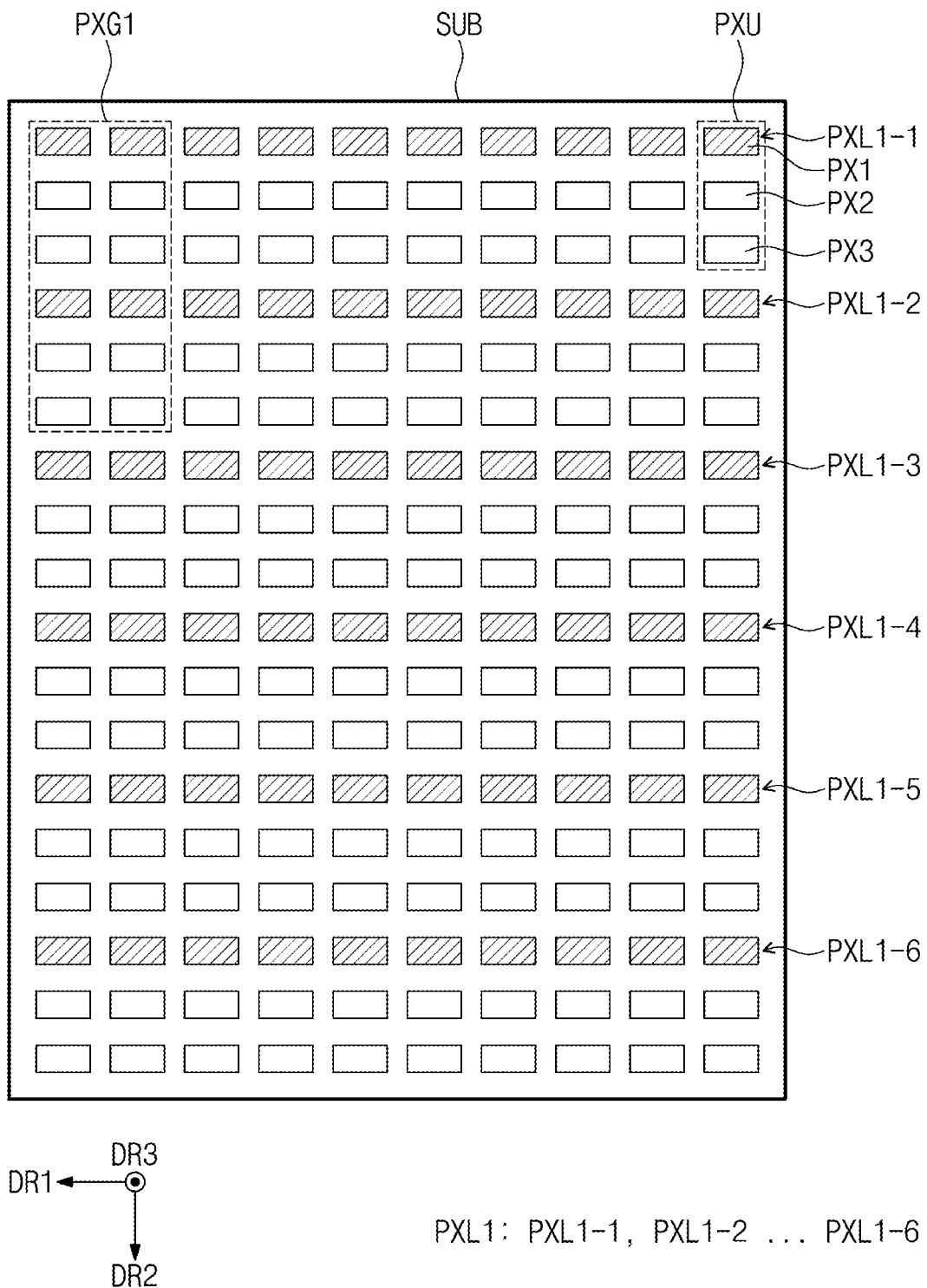
FIG. 1A is a plan view of an embodiment of a target substrate on which an organic layer is formed according to an inkjet spraying method according to the invention.

Hereinafter, embodiments of the invention will be described with reference to the accompanying drawings. In the disclosure, when an element (or a region, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or" includes all combinations of one or more of which associated configurations may define.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an inkjet spraying method, an inkjet spraying device, and a display panel manufacturing method using the same in an embodiment of the invention will be described with reference to the accompanying drawings.

Figure 1B:
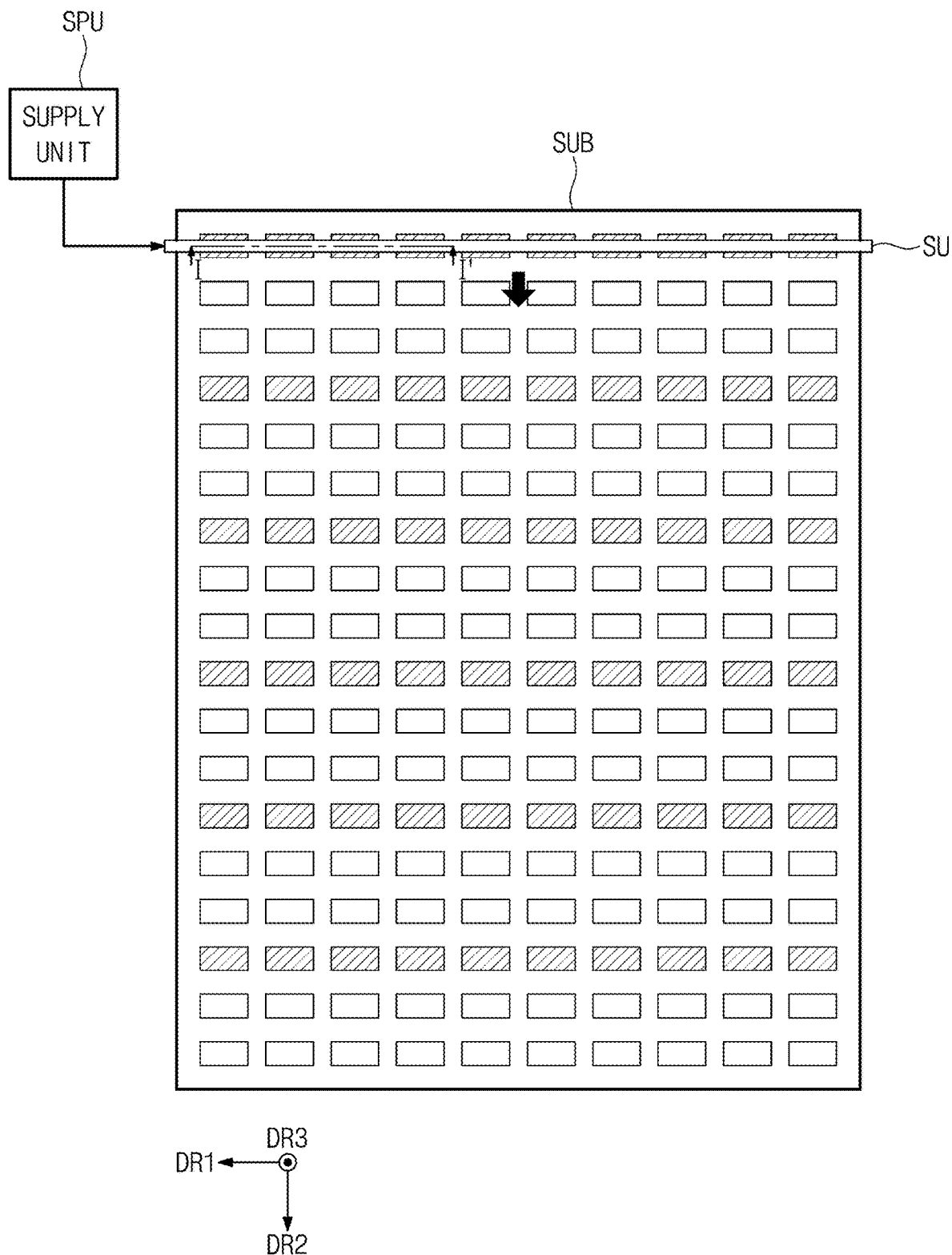
FIGS. 1B to 1E are plan views illustrating an embodiment of an inkjet spraying device according to the invention and an inkjet spraying method performed by the same.

FIG. 1A is a plan view of an embodiment of a target substrate on which an organic layer is formed according to an inkjet spraying method according to the invention. FIGS. 1B to 1E are plan views illustrating an embodiment of an inkjet spraying device according to the invention and an inkjet spraying method performed by the same. FIGS. 1F to 1I are cross-sectional views of an embodiment of a portion of an inkjet spraying device according to the invention. FIG. 1J is a plan view of an embodiment of a portion of a target substrate on which an organic layer is formed according to an inkjet spraying method according to the invention. FIG. 1F illustrates a cross-section taken along cut-line I-I' shown in FIG. 1B. FIG. 1G illustrates a cross-section taken along cut-line II-IP shown in FIG. 1C. FIG. 1H illustrates a cross-section taken along cut-line shown in FIG. 1D. FIG. 1I illustrates a cross-section taken along cut-line IV-IV' shown in FIG. 1E. FIG. 1J illustrates an enlarged pixel group in the plan view of the target substrate shown in FIG. 1A.

Referring to FIG. 1A, a target substrate SUB includes a plurality of pixels PX1, PX2, and PX3. The target substrate SUB may be an intermediate substrate in which at least a portion of organic layers included in the plurality of pixels PX1, PX2, and PX3 is not completely formed. The target substrate SUB may have a quadrangular (e.g., rectangular) plate shape in parallel with a plane defined along the first direction DR1 and the second direction DR2. The plurality of pixels PX1, PX2, and PX3 may be disposed in a matrix form arranged along the first direction DR1 and the second direction DR2. However, the invention is not limited thereto, and the plurality of pixels PX1, PX2, and PX3 may be disposed in various other forms. For convenience of description, FIG. 1A illustrates that pixels in 10 columns are spaced apart along the first direction DR1, pixels in 18 rows are spaced apart along the second direction DR2, but more numbers of pixels may be arranged on the actual target substrate SUB. In addition, the plurality of pixels PX1, PX2, and PX3 may be disposed in a stripe form or a pentile form as well as in a matrix form.

A plurality of first pixels PX1, a plurality of second pixels PX2, and a plurality of third pixels PX3 may be disposed on the target substrate SUB. The plurality of first pixels PX1, the plurality of second pixels PX2, and the plurality of third pixels PX3 each may include a plurality of rows disposed parallel along to the first direction DR1. Hereinafter, the first direction DR1 herein may be also referred to as a row direction. The plurality of rows of each of the plurality of first pixels PX1, the plurality of second pixels PX2, and the plurality of third pixels PX3 may be spaced apart along to the second direction DR2. Hereinafter, the second direction DR2 herein may be also referred to as a column direction.

The plurality of first pixels PX1, the plurality of second pixels PX2, and the plurality of third pixels PX3 disposed on the target substrate SUB may each display different colors from each other. The plurality of first pixels PX1 may all display the same first color light, the plurality of second pixels PX2 may all display the same second color light different from the first color light, and the plurality of third pixels PX3 may all display the same third color different from the first color light and the second color light. In an embodiment, the plurality of first pixels PX1 may all display blue light, the plurality of second pixels PX2 may all display green light, and the plurality of third pixels PX3 may all display red light. In an embodiment, the first light, i.e., blue light may be light having a wavelength range of about 410 nanometers (nm) to about 480 nm, the second light, i.e., green light may be light having a wavelength range of about 500 nm to about 570 nm, and the third light, i.e., red light may be light having a wavelength range of about 625 nm to about 675 nm. Hereinafter, in the description, one first pixel PX1, one second pixel PX2, and one third pixel PX3, which are adjacent, in the plurality of first pixels PX1, the plurality of second pixels PX2, and the plurality of third pixels PX3 may be combined into one and referred to as one pixel unit PXU.

The plurality of first pixels PX1 may include a plurality of first-pixel (hereinafter also referred to as "1P") rows PXL1. The plurality of 1P rows PXL1 may include a first 1P row PXL1-1, a second 1P row PXL1-2, a third 1P row PXL1-3, a fourth 1P row PXL1-4, a fifth 1P row PXL1-5, and a sixth 1P row PXL1-6 which extend along the first direction DR1 and are spaced apart along the second direction DR2. The plurality of first pixels PX1 arranged along the first direction DR1 may be disposed in each of the plurality of 1P rows PXL1-1, PXL1-2, PXL1-3, PXL1-4, PXL1-5, and PXL1-6.

Referring to FIGS. 1A to 1J together, the inkjet spraying device in an embodiment of the invention includes a spraying unit SU which sprays an organic material on the target substrate SUB. The spraying unit SU may be disposed on the target substrate SUB. The inkjet spraying device in an embodiment may further include a supply unit SPU which is connected to the spraying unit SU and provides the organic material to be sprayed through the spraying unit SU. The organic material provided by the supply unit SPU may be, for example, a luminous material. The organic material provided by the supply unit SPU to the spraying unit SU may be a luminous material which emits one color light. The luminous material provided by the supply unit SPU to the spraying unit SU may be equally provided to a plurality of nozzles included in the spraying unit SU.

Although not shown, the inkjet spraying device in an embodiment of the invention may further include a transfer part which transfers the spraying unit SU. By the transfer part, the spraying unit SU may be moved along the second direction DR2 that is a column direction of the plurality of first pixels PX1. While moving along the second direction DR2, the spraying unit SU may spray the organic material to each row of the plurality of first pixels PX1 disposed along the first direction DR1. The spraying unit SU may extend along the first direction DR1 that is a row direction of the first pixels PX1. The length in which the spraying unit SU extends along the first direction DR1 may vary depending on the number of columns in which the first pixels PX1 are disposed. FIG. 1B illustrates that the spraying unit SU extends to overlap the whole length of the row in which the first pixels PX1 are disposed, but the invention is not limited thereto, and the spraying unit SU may extend to overlap only a portion of the whole length of the rows in which the plurality of pixels PX1, PX2, and PX3 are disposed. The spraying unit SU may spray the organic material to the first pixels PX1 of a (1+a×n)th 1P row in the plurality of 1P rows PXL1. In the description, n may be an integer of 2 or more, and a may be an integer of 0 or more where n may be each number of row and column of the first pixels PX1 disposed in a 1P group PXG1. That is, in an embodiment illustrated in FIGS. 1A to 1J, n is 2, and in the 1P group PXG1, the first pixels PX1 may be included in two columns in a first 1P row PXL1-1 and a second 1P row PXL1-2. n may be set to adjust the number of the first pixels PX1 disposed in the 1P group PXG1 according to the number of the organic material drops. Hereinafter, the 1P group PXG1 will be described in detail below.

The spraying unit SU may spray the organic material to the first pixels PX1 of a (2+a×n)th 1P row in the plurality of 1P rows PXL1. The spraying of the organic material to the first pixels PX1 of the (2+a×n)th 1P row may be performed after the spraying of the organic material to the first pixels PX1 of the (1+a×n)th 1P row. In other words, after a process for spraying the organic material to the first pixels PX1 disposed in all the rows corresponding to the (1+a×n)th 1P row in the plurality of 1P rows PXL1 is performed, a process for spraying the organic material to the first pixels PX1 of rows corresponding to the (2+a×n)th 1P row may be performed. In an embodiment illustrated in FIGS. 1A to 1J, n is 2, for example, and after a process for spraying the organic material to the first pixels PX1 disposed in all the rows corresponding to a (1+a×2)th 1P row, i.e., all the odd-numbered rows, of the plurality of 1P rows PXL1 is performed, a process for spraying the organic material to the first pixels PX1 disposed in all the rows corresponding to a (2+a×2)th 1P row, i.e., all the even-numbered rows may be performed.

Figure 1C:
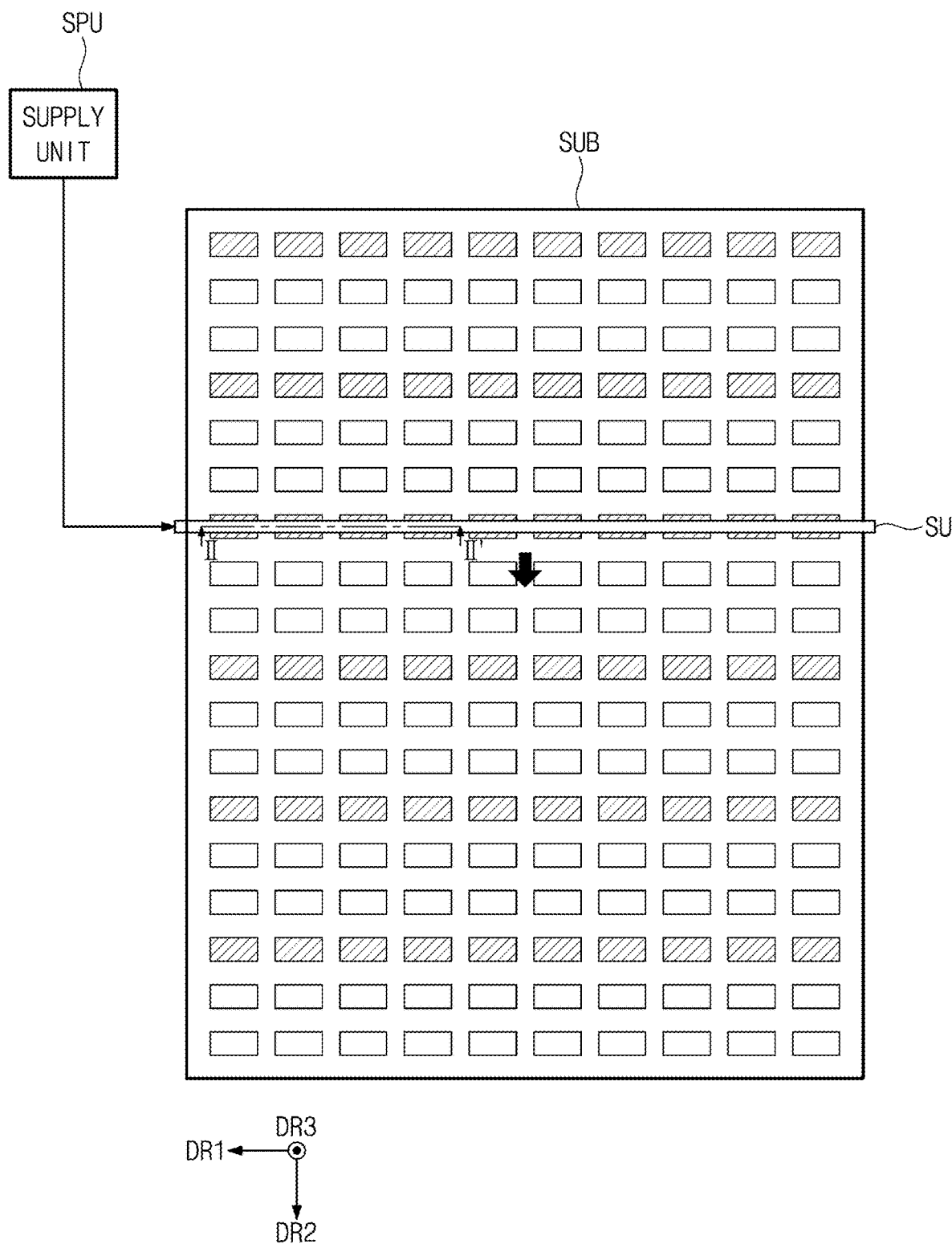

In more detail, in the spraying of the organic material to the plurality of first pixels PX1, the spraying unit SU may spray the organic material in the first 1P row PXL1-1 as in FIG. 1B, and may spray the organic material in a third 1P row PXL1-3 as in FIG. 1C. Although not shown, after the organic material is sprayed in the third 1P row PXL1-3, the organic material may be sequentially sprayed in the odd rows such as a fifth 1P row PXL1-5, a seventh 1P row, and a ninth 1P row. After the process for spraying the organic material in the odd rows is completed, the spraying unit SU may return to a starting point and spray the organic material in the second 1P row PXL1-2 as in FIG. 1D, and may spray the organic material in the fourth 1P row PXL1-4 as in FIG. 1E. Although not shown, after the organic material is sprayed in the fourth 1P row PXL1-4, the organic material may be sequentially sprayed in the even rows such as a sixth 1P row PXL1-6, an eighth 1P row, and a tenth 1P row.

The spraying unit SU includes the plurality of nozzles. The spraying unit SU may extend along the first direction DR1 that is a row direction of the first pixels PX1, and may include the plurality of nozzles spaced apart along the first direction DR1. The spraying unit SU may include a first nozzle NZ1, a second nozzle NZ2, a third nozzle NZ3, a fourth nozzle NZ4, and a fifth nozzle NZ5 corresponding to each pixel. FIGS. 1F to 1I illustrate only the first nozzle NZ1, the second nozzle NZ2, the third nozzle NZ3, the fourth nozzle NZ4, and the fifth nozzle NZ5, but at least six nozzles may be included in the spraying unit SU. The number of the plurality of nozzles included in the spraying unit SU may be determined depending on the length extending along the first direction DR1. The number of the plurality of nozzles included in the spraying unit SU may be determined corresponding to the number of the first pixels PX1 overlapping the spraying unit SU in the first pixel row PXL1 extending along the first direction DR1.

The plurality of nozzles NZ1, NZ2, NZ3, NZ4, and NZ5 each may include a plurality of sub-nozzles. The number of the sub-nozzles included in each of the plurality of nozzles NZ1, NZ2, NZ3, NZ4, and NZ5 may be determined depending on the number of the organic material drops sprayed by the plurality of nozzles NZ1, NZ2, NZ3, NZ4, and NZ5 each corresponding to the first pixels PX1. As shown in FIGS. 1F to 1I, the plurality of nozzles NZ1, NZ2, NZ3, NZ4, and NZ5 each may include m sub-nozzles. That is, the first nozzle NZ1 may include a first-1 sub-nozzle NZ1-1 to a first-m sub-nozzle NZ1-$m$, the second nozzle NZ2 may include a second-1 sub-nozzle NZ2-1 to a second-m sub-nozzle NZ2-$m$, the third nozzle NZ3 may include a third-1 sub-nozzle NZ3-1 to a third-m sub-nozzle NZ3-$m$, the fourth nozzle NZ4 may include a fourth-1 sub-nozzle NZ4-1 to a fourth-m sub-nozzle NZ4-$m$, and the fifth nozzle NZ5 may include a fifth-1 sub-nozzle NZ5-1 to a fifth-m sub-nozzle NZ5-$m$, where m may be the number of the organic material drop sprayed to each of the first pixels PX1. In an embodiment, m may be an integer of one to nine. As shown in FIG. 1J, the number of the organic material drops dropped in each of the first pixels PX1 may be seven, and m may be seven. That is, the number of the sub-nozzles included in each of the plurality of nozzles NZ1, NZ2, NZ3, NZ4, and NZ5 may be seven.

The target substrate SUB in an embodiment may be a partition wall BK that is disposed on the base substrate BSL. A plurality of openings is defined in the partition wall BK, and the plurality of pixels PX1, PX2, and PX3 in an embodiment may be formed in the plurality of openings defined in the partition wall BK. The plurality of first pixels PX1 may be formed, through the organic material OM sprayed by the spraying unit SU, in the plurality of openings defined in the partition wall BK.

Figure 1D:
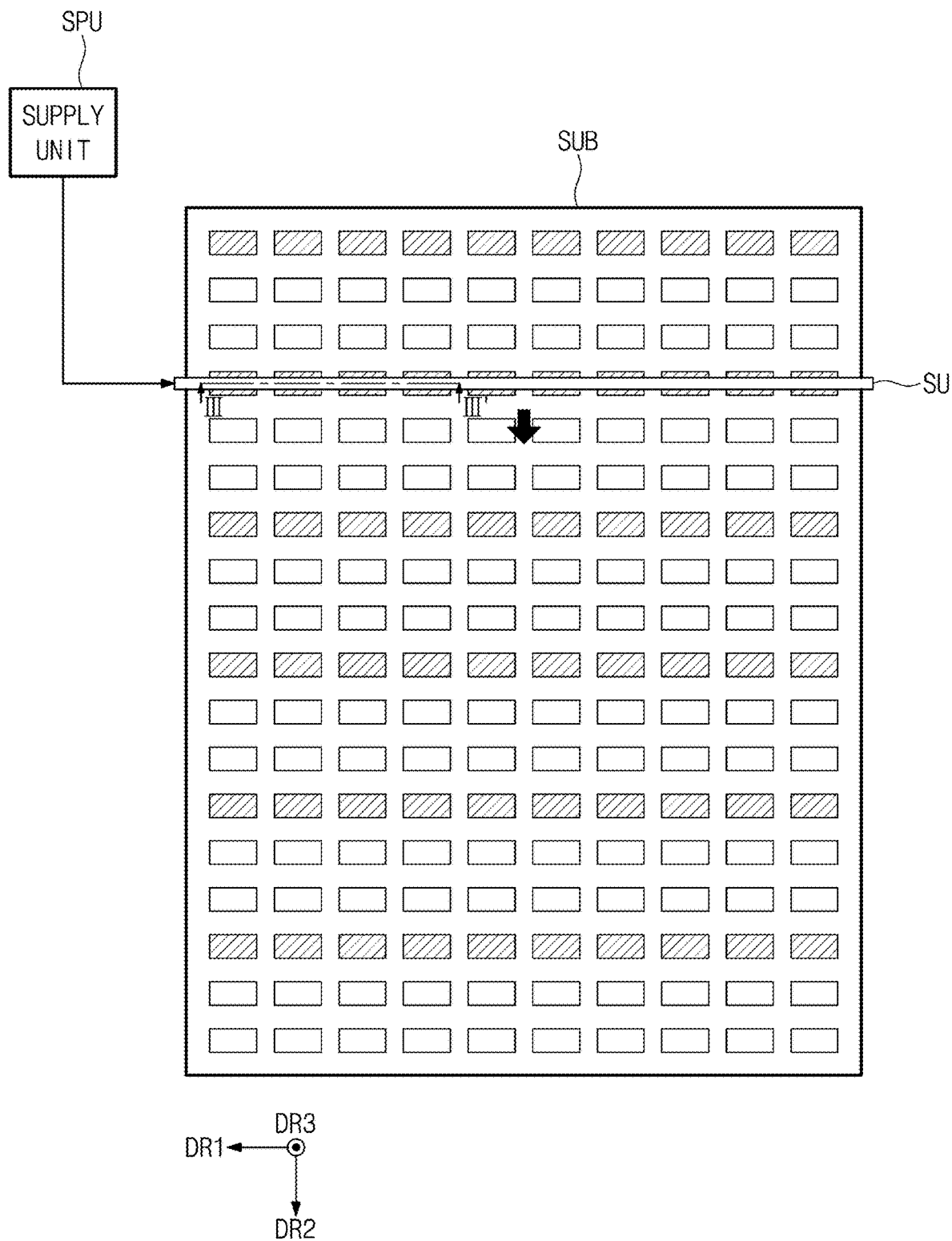
Figure 1E:
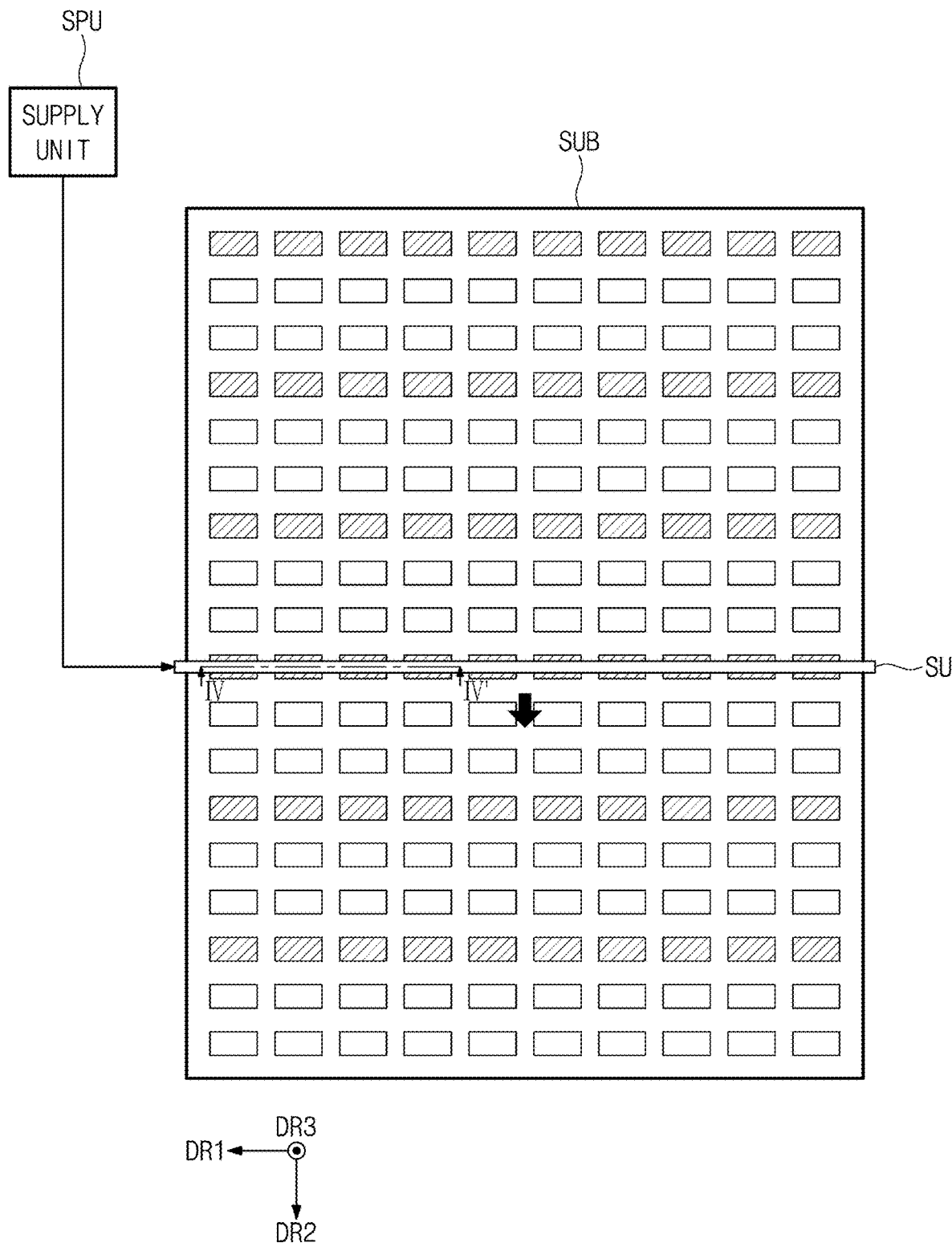
Figure 1F:
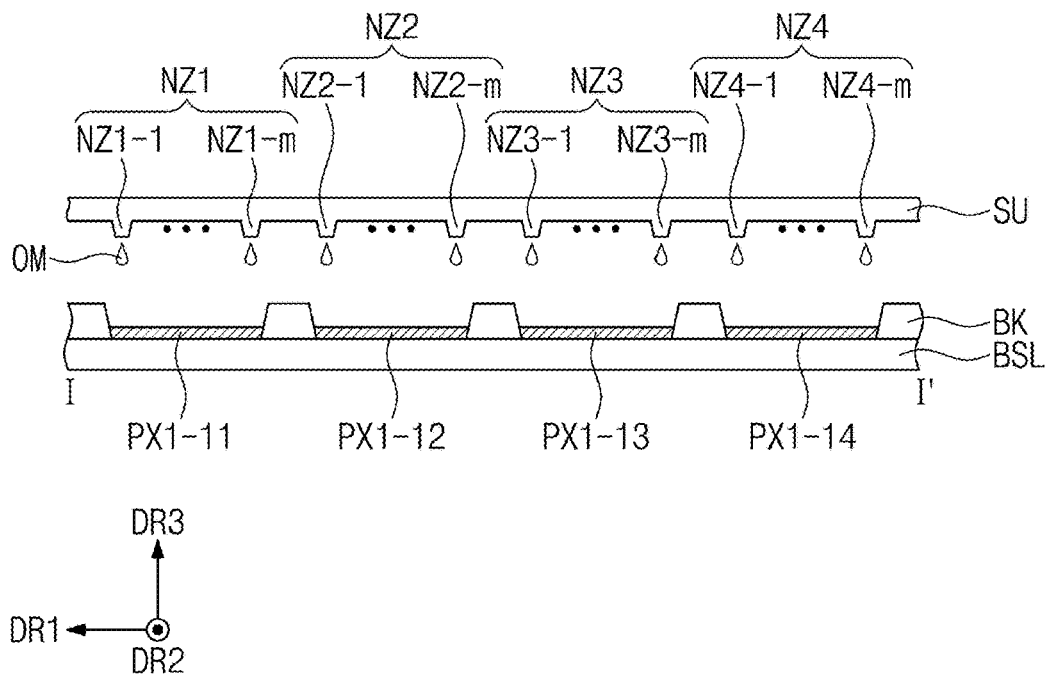
FIGS. 1F to 1I are cross-sectional views of an embodiment of a portion of an inkjet spraying device according to the invention.
Figure 1G:
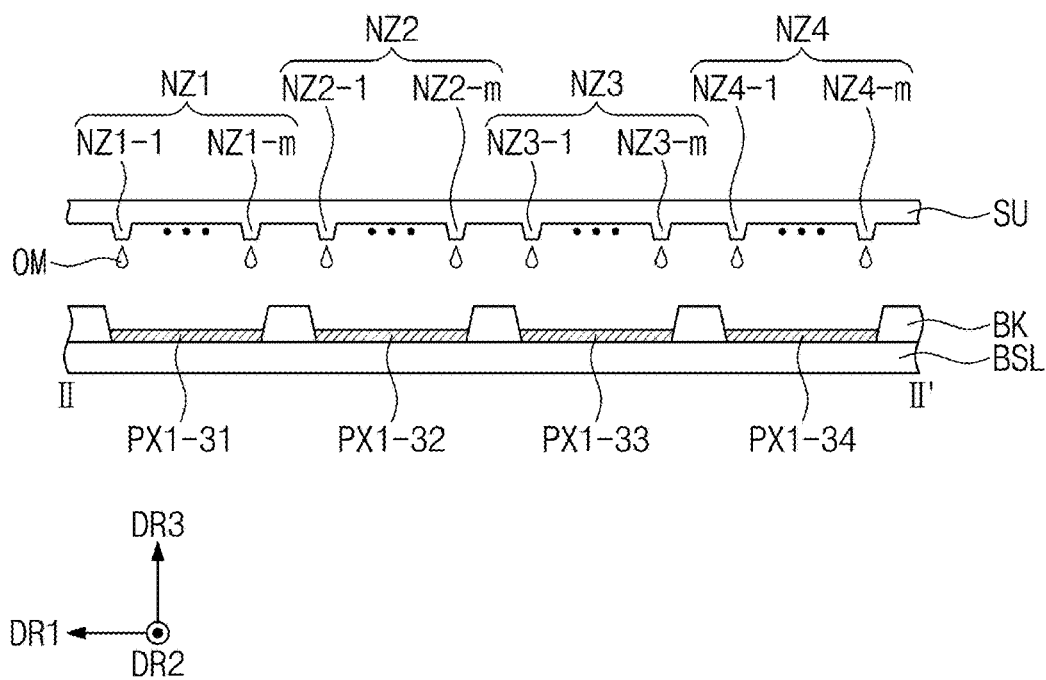
Figure 1H:
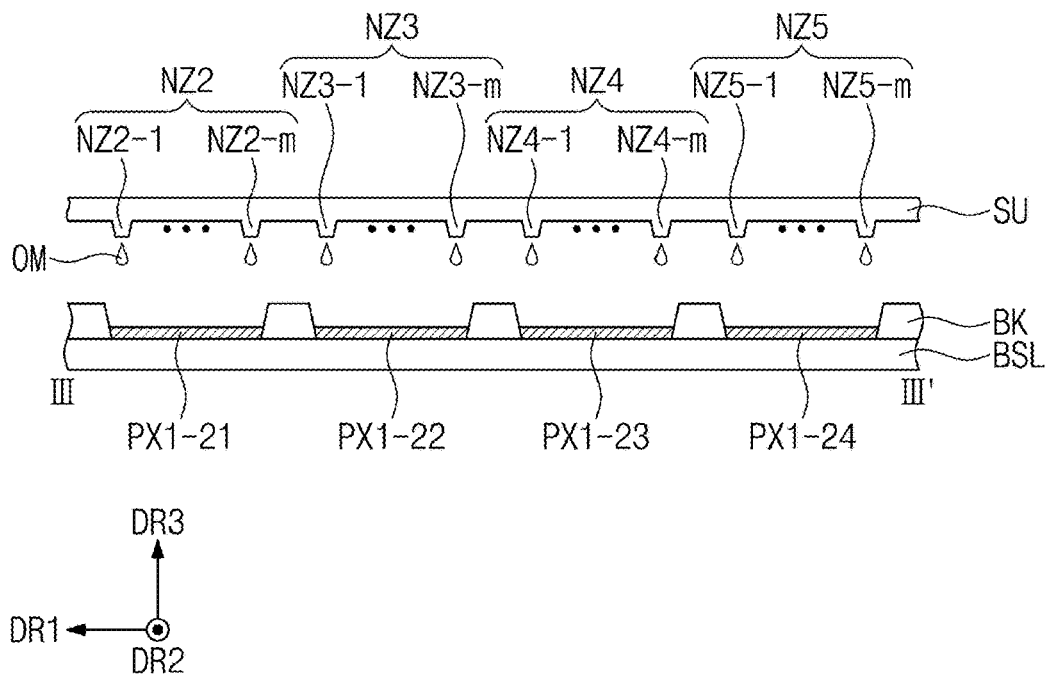
Figure 1I:
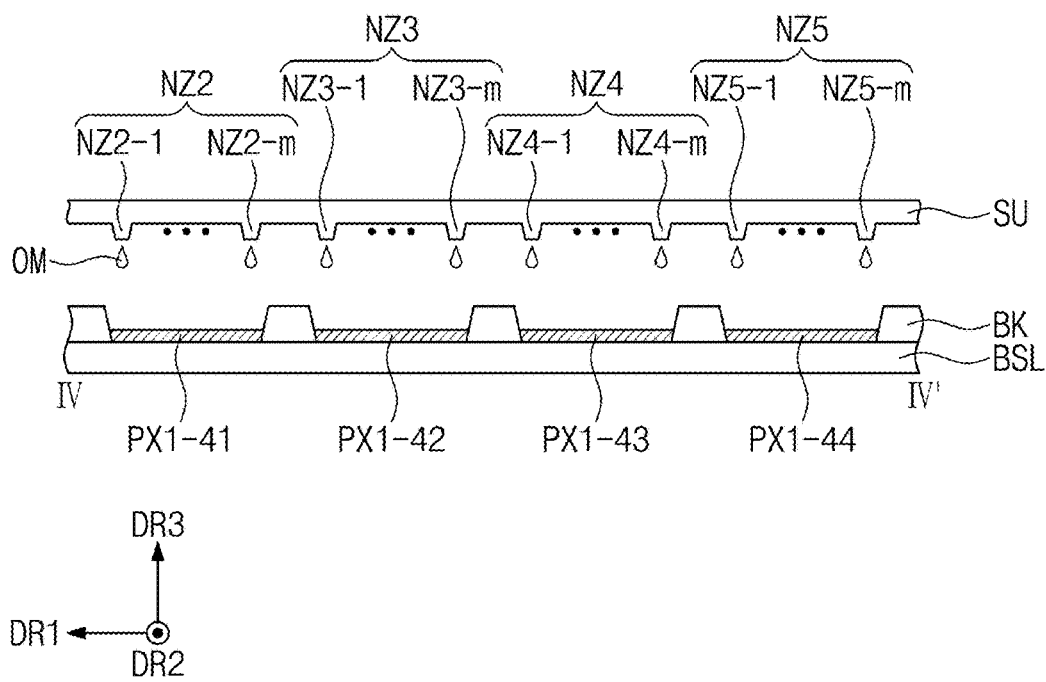
Figure 1J:
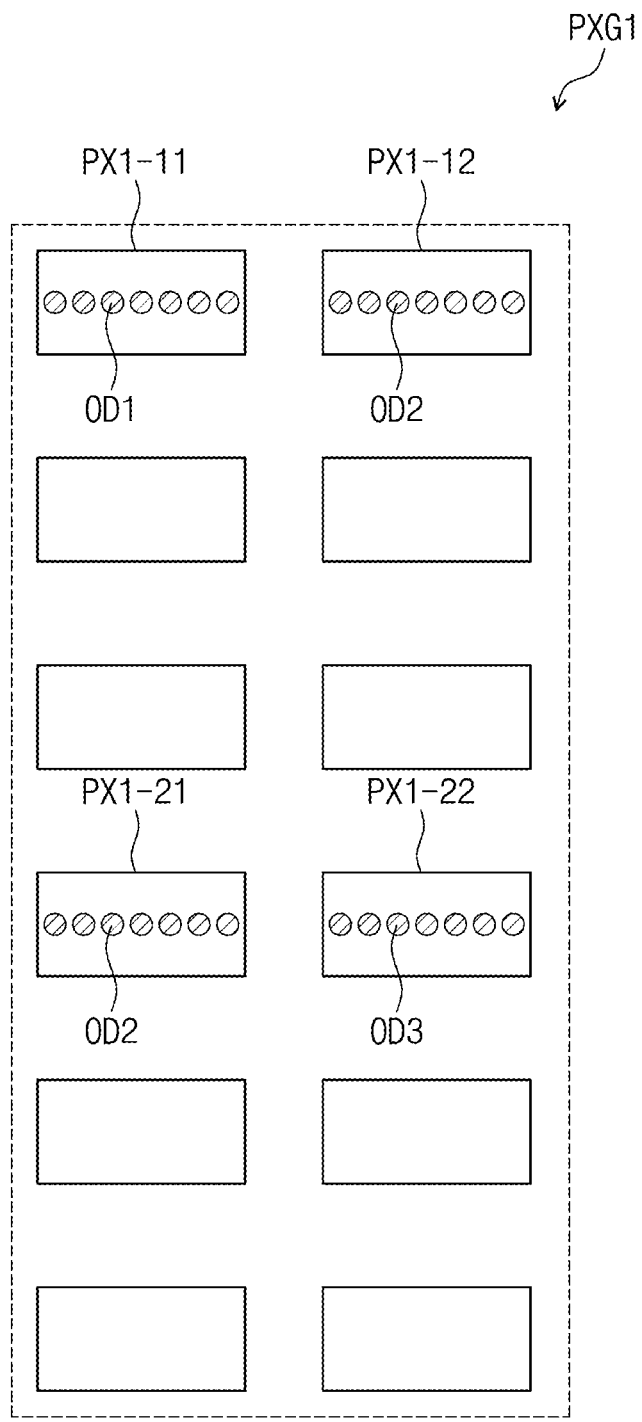
FIG. 1J is a plan view of an embodiment of a portion of a target substrate on which an organic layer is formed according to an inkjet spraying method according to the invention.

Each of the plurality of nozzles included in each spraying unit SU may spray the organic material to the corresponding first pixel PX1 of the plurality of first pixels PX1 included in any one row of the plurality of 1P rows PXL1-1, PXL1-2, PXL1-3, PXL1-4, PXL1-5, and PXL1-6. As shown in FIGS. 1B and 1F, in the spraying of the organic material in the first 1P row PXL1-1, the first nozzle NZ1 may spray the organic material OM to a first 1P row-first unit pixel PX1-11, the second nozzle NZ2 may spray the organic material OM to a first 1P row-second unit pixel PX1-12, the third nozzle NZ3 may spray the organic material OM to a first 1P row-third unit pixel PX1-13, and the fourth nozzle NZ4 may spray the organic material OM to a first 1P row-fourth unit pixel PX1-14. As shown in FIGS. 1C and 1G, in the spraying of the organic material in the third 1P row PXL1-3, the first nozzle NZ1 may spray the organic material OM to a third 1P row-first unit pixel PX1-31, the second nozzle NZ2 may spray the organic material OM to a third 1P row-second unit pixel PX1-32, the third nozzle NZ3 may spray the organic material OM to a third 1P row-third unit pixel PX1-33, and the fourth nozzle NZ4 may spray the organic material OM to a third 1P row-fourth unit pixel PX1-34. As shown in FIGS. 1D and 1H, in the spraying of the organic material in the second 1P row PXL1-2, the second nozzle NZ2 may spray the organic material OM to a second 1P row-first unit pixel PX1-21, the third nozzle NZ3 may spray the organic material OM to a second 1P row-second unit pixel PX1-22, the fourth nozzle NZ4 may spray the organic material OM to a second 1P row-third unit pixel PX1-23, and the fifth nozzle NZ5 may spray the organic material OM to a second 1P row-fourth unit pixel PX1-24. As shown in FIGS. 1E and 1I, in the spraying of the organic material in the fourth 1P row PXL1-4, the second nozzle NZ2 may spray the organic material OM to a fourth 1P row-first unit pixel PX1-41, the third nozzle NZ3 may spray the organic material OM to a fourth 1P row-second unit pixel PX1-42, the fourth nozzle NZ4 may spray the organic material OM to a fourth 1P row-third unit pixel PX1-43, and the fifth nozzle NZ5 may spray the organic material OM to a fourth 1P row-fourth unit pixel PX1-44.

In an embodiment of the target substrate SUB, the size of one 1P group PXG1 may be determined to spray a predetermined number or more of the organic material drop to one 1P group PXG1 considering the number of the organic material drops that the spraying unit SU which sprays the organic material to the target substrate SUB sprays to each of the first pixels PX1. The size of the 1P group PXG1 may vary depending on an n value. One 1P group PXG1 may include n×n of the first pixels PX1. As an embodiment illustrated in FIGS. 1A and 1J, n is 2, the first pixels PX1 of two columns in the first direction DR1 and two rows in the second direction DR2 may be included in one 1P group PXG1. One 1P group PXG1 may include n×n of the pixel units PXU.

By the plurality of nozzles NZ1, NZ2, NZ3, NZ4, and NZ5 included in the spraying unit SU, a predetermined number of the organic material drops may be sprayed to each of the first pixels PX1. In an embodiment, the number of the organic material drops sprayed to each of the first pixels PX1 by the plurality of nozzles NZ1, NZ2, NZ3, NZ4, and NZ5 may be one to nine. FIG. 1J illustrates that seven organic material drops OD1, OD2, and OD3 are sprayed to each of the first pixels PX1-11, PX1-12, PX1-21, and PX1-22, but the invention is not limited thereto.

In an embodiment of an inkjet spraying method, in the spraying of the organic material to each of the first pixels of the (1+a×n)th 1P row in the plurality of first pixels and the spraying of the organic material to each of the first pixels of the (2+a×n)th 1P row in the plurality of first pixels, the nozzle which sprays the organic material to a first reference pixel in the first pixels of the (1+a×n)th 1P row is different from the nozzle which sprays the organic material to a second reference pixel which is disposed in a column direction in parallel with the first reference pixel in the first pixels of the (2+a×n)th 1P row. That is, when the organic material is sprayed to the first reference pixel in the first pixels of the (1+a×n)th 1P row through the first nozzle, the organic material is sprayed to the second reference pixel which is disposed in the column direction in parallel with the first reference pixel in the first pixels of the (2+a×n)th 1P row through the second nozzle different from the first nozzle. The second nozzle which sprays the organic material to the second reference pixel may spray to another first pixel different from the first reference pixel in the first pixels of the (1+a×n)th 1P row. In an embodiment, as shown in FIGS. 1A to 1J, the second nozzle NZ2 may spray the organic material OM not to the first 1P row-first unit pixel PX1-11 that is the first reference pixel in the first pixels of the first 1P row PXL1-1 but to the first 1P row-second unit pixel PX1-12 that is a first same row pixel disposed in the same row as the first 1P row-first unit pixel PX1-11, for example.

As shown in FIGS. 1A to 1J, when n is 2, the nozzle which sprays the organic material to the first reference pixel in the first pixels of the odd-numbered rows is different from the nozzle which sprays the organic material to the second reference pixel disposed in the column direction in parallel with the first reference pixel in the first pixels of the even-numbered rows. More specifically, the first nozzle NZ1 sprays the organic material OM to the first 1P row-first unit pixel PX1-11 that is the first reference pixel in the first pixels of the first 1P row PXL1-1, the odd row, and the second nozzle NZ2 different from the first nozzle NZ1 sprays the organic material OM to the second 1P row-first unit pixel PX1-21 that is disposed in the same column as the first reference pixel in the first pixels of the second 1P row PXL1-2, the even row. The first nozzle NZ1 sprays the organic material OM to the third 1P row-first unit pixel PX1-31 that is the first reference pixel in the first pixels of the third 1P row PXL1-3, the odd row, and the second nozzle NZ2 different from the first nozzle NZ1 sprays the organic material OM to the fourth 1P row-first unit pixel PX1-41 that is disposed in the same column as the first reference pixel in the first pixels of the fourth 1P row PXL1-4, the even row. In the first 1P row PXL1-1, the odd row, the second nozzle NZ2 may spray the organic material OM to the first 1P row-second unit pixel PX1-12, and in the third 1P row PXL1-3, the second nozzle NZ2 may spray the organic material OM to the third 1P row-second unit pixel PX1-32.

The inkjet spraying method in an embodiment of the invention may further include shifting the spraying unit SU along the first direction DR1 that is a row direction after the spraying of the organic material to each of the first pixels of the (1+a×n)th 1P row in the plurality of first pixels and before performing the spraying of the organic material to each of the first pixels of the (2+a×n)th 1P row in the plurality of first pixels. Thus, the nozzle which sprays the organic material to the first reference pixel in the first pixels of the (1+a×n)th 1P row may be different from the nozzle which sprays the organic material to the second reference pixel which is disposed in the column direction in parallel with the first reference pixel in the first pixels of the (2+a×n)th 1P row.

As shown in FIGS. 1F to 11, the inkjet spraying method in an embodiment may perform the spraying of the organic material to each of the first pixels of the even-numbered rows after shifting the spraying unit SU in a predetermined distance along the first direction DR1 after the spraying of the organic material to each of the first pixels of the odd-numbered row. FIGS. 1F to 11 illustrate that the spraying unit SU is shifted in a one-pixel distance along the first direction DR1 after the spraying of the organic material to each of the first pixels of the odd-numbered rows. That is, it is illustrated that the second nozzle NZ2 sprays the organic material OM to the first 1P row-second unit pixel PX1-12 adjacent to the first 1P row-first unit pixel PX1-11 that is the first reference pixel in the first 1P row PXL1-1, the spraying unit SU is shifted in the one-pixel distance in the first 1P row PXL1-1, and thus the second nozzle NZ2 sprays the organic material OM to the second 1P row-first unit pixel PX1-21 which is in the column direction in parallel with the first 1P row-first unit pixel PX1-11. However, the invention is not limited thereto, and the distance in which the spraying unit SU is shifted along the first direction DR1 may be variously selected. In an embodiment, in the spraying of the organic material to each of the first pixels of the odd-numbered row, the first nozzle NZ1 sprays the organic material OM to the first 1P row-first unit pixel PX1-11 that is the first reference pixel in the first 1P row PXL1-1, the spraying unit SU may be shifted in a two-pixel distance along the first direction DR1, and then the third nozzle NZ3 may spray the organic material OM to the second 1P row-first unit pixel PX1-21 which is in the column direction in parallel with the first 1P row-first unit pixel PX1-11 in the spraying of the organic material to each of the first pixels of the even-numbered row, for example. In an alternative embodiment, the spraying unit SU may be shifted in at least three-pixel distance along the first direction DR1. Although not shown, the distance in which the spraying unit SU is shifted along the first direction DR1 is not as far as a unit pixel-distance, for example, the spraying unit SU may further include an additional nozzle disposed above the partition wall BK in the spraying of the organic material to the first pixel of the (1+a×n)th 1P row, and in the spraying of the organic material to the first pixel of the (2+a×n)th 1P row, the spraying unit SU may be shifted so that the additional nozzle sprays the organic material to the second reference pixel.

In the inkjet spraying device and the inkjet spraying method in an embodiment of the invention, the organic material drops derived from one spraying nozzle of the spraying unit SU are sprayed to one first pixel of the first pixels PX1-11, PX1-12, PX1-21, and PX1-22, but in a 1P group PXG1 unit, the organic material drops derived from a plurality of spraying nozzles of the spraying unit SU may be mixed and sprayed. In addition, in one 1P group PXG1, n×n times organic material drops than the organic material drops sprayed in one first pixel may be mixed. In one 1P group PXG1, first organic material drops OD1 derived from the first nozzle NZ1 may be sprayed to the first 1P row-first unit pixel PX1-11, second organic material drops OD2 derived from the second nozzle NZ2 may be sprayed to the first 1P row-second unit pixel PX1-12 and the second 1P row-first unit pixel PX1-21, and third organic material drops OD3 derived from the third nozzle NZ3 may be sprayed to the second 1P row-second unit pixel PX1-22. That is, unit pixels included in one 1P group PXG1 may include the organic material drops derived from a total of three nozzles. However, the invention is not limited thereto, and when the distance in which the spraying unit SU is shifted is a two-pixel distance or more, the unit pixels included in one 1P group PXG1 may include the organic material drops derived from a total of four nozzles. The unit pixels included in one 1P group PXG1 may include the organic material drops derived from a total of n to n×n nozzles (exclusive of n). The sizes of the plurality of organic material drops OD1, OD2, and OD3 are the same as a process design, but a distribution may occur due to the difference of the nozzles. In an alternative embodiment, the sizes of the plurality of organic material drops OD1, OD2, and OD3 may be differently adjusted so that the total spraying amount of the organic material drops to be provided to each 1P group PXG1 may be the same.

In an embodiment of the inkjet spraying device and the inkjet spraying method, adding the shifting of the spraying unit between the spraying of the organic material to the first pixels of the (1+a×n)th 1P row and the first pixels of the (2+a×n)th 1P row with respect to the plurality of pixel rows may decrease a distribution between the total discharge amount of the organic material drops sprayed to each 1P group PXG1. Therefore, film uniformity of the organic layers included in the display panel manufactured by the inkjet spraying method and the inkjet spraying device in an embodiment may be improved, thereby providing a display panel having improved display quality and reliability.

More specifically, when explaining an effect of the inkjet spraying device and the inkjet spraying method in an embodiment of the invention, since in an existing display panel with a low resolution, the size of each pixel is large for the size of each nozzle of the inkjet spraying device, it is possible to provide a plurality of organic material drops in one pixel by performing the spraying multiple times through the spraying nozzle of the spraying unit, but since in the high resolution display panel, the size of each pixel is reduced, it is impossible in a process to provide the organic material drops to one pixel by performing the spraying multiple times through the spraying nozzle of the spraying unit. In addition, as the pixel size is reduced, the number of organic material drops provided to one pixel is limited. Therefore, the film uniformity of the organic layer due to the distribution difference between each organic material drop may be reduced.

However, in the inkjet spraying device and the inkjet spraying method in an embodiment of the invention, a plurality of organic material drops may be provided, in a pixel group unit including n×n pixel units, through the spraying nozzle of the spraying unit, and n×n times organic material drops may be mixed in the 1P group compared to the organic material drops sprayed to one pixel. In addition, the shifting of the spraying unit is performed between the spraying of the organic material to the first pixels of the (1+a×n)th 1P row and the first pixels of the (2+a×n)th 1P row, and thus the nozzle which sprays the organic material to the first reference pixel in the first pixels of the (1+a×n)th 1P row may be different from the nozzle which sprays the organic material to the second reference pixel which is disposed in the column direction in parallel with the first reference pixel in the first pixels of the (2+a×n)th 1P row. That is, the inkjet process is performed not in one pixel but in a pixel group unit including n×n pixel units, in the pixel group unit, more various types of the spraying nozzles perform the spraying of the organic material, and thus the film uniformity of the organic layer formed by mixing the organic material drops in the pixel group unit may be improved and stains that are visible from the outside may be reduced. Therefore, the display panel manufactured by the inkjet spraying device and the inkjet spraying method in an embodiment of the invention may have improved display quality and reliability.

Although not shown, the spraying unit SU included in the inkjet spraying device in an embodiment of the invention may be inclined at a predetermined angle. More specifically, the spraying unit SU may be inclined at a predetermined angle with respect to the second direction DR2 in which the spraying unit SU moves, and the inclined spraying unit SU may move in order to spray the organic material to the plurality of first pixels PX1.

The spraying unit SU may be included at a predetermined interval in order to bring an interval between any two among the plurality of nozzles included in the spraying unit SU to match an interval between the pixel columns corresponding to each of the plurality of nozzles. In an embodiment of the inkjet spraying device, the spraying of the organic material is performed while moving the inclined spraying unit SU, and thus the inkjet spraying process may be performed in a manufacturing process of various display panels having a different interval between pixel columns.

Figure 2A:
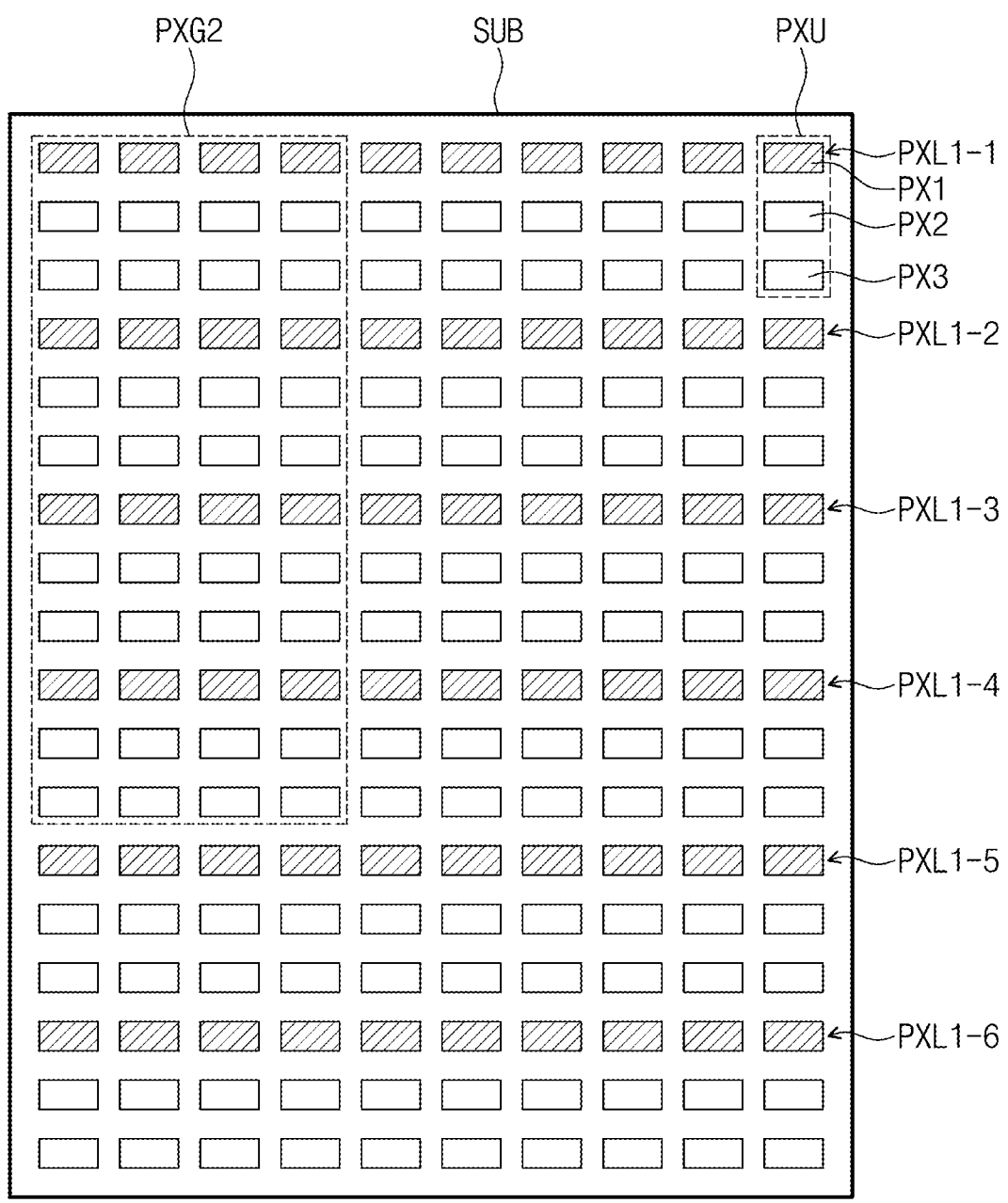
FIG. 2A is a plan view of an embodiment of a target substrate on which an organic layer is formed according to an inkjet spraying method according to the invention.

FIG. 2A is a plan view of a target substrate on which an organic layer is formed according to another embodiment of an inkjet spraying method according to the invention. FIGS. 2B to 2G are plan views of another embodiment of an inkjet spraying device according to the invention. FIG. 2H is a plan view of another embodiment of a portion of a target substrate on which an organic layer is formed according to an inkjet spraying method according to the invention. FIG. 2H illustrates an enlarged 1P group in the plan view of the target substrate shown in FIG. 2A. Hereinafter, in describing the inkjet spraying device in an embodiment of the invention with reference to FIGS. 2A to 2H, the same reference numerals will be assigned to the same constituents as those described above, and detailed descriptions will be omitted.

FIGS. 2A to 2H illustrate an embodiment where rows and columns of each of first pixels PX1 included in one 1P group PXG2 are four in the inkjet spraying device and the inkjet spraying method. That is, n is 4, and in the 1P group PXG2, the first pixels PX1 in each of a first 1P row PXL1-1, a second 1P row PXL1-2, a third 1P row PXL1-3, and a fourth 1P row PXL1-4 may be included in four columns. In an embodiment, 4×4, i.e., 16 pixel units PXU may be included in one 1P group PXG2.

In an embodiment of the inkjet spraying device and the inkjet spraying method, when n is an integer of 4 or more, the spraying of the organic material to each of the first pixels of a (3+a×n)th 1P row in the plurality of first pixels and the spraying of the organic material to each of the first pixels of a (4+a×n)th 1P row in the plurality of first pixels may be performed after the spraying of the organic material to each of the first pixels of the (2+a×n)th 1P row in the plurality of first pixels. Referring to FIGS. 2A to 2H, n is 4, a process for spraying the organic material to the first pixels PX1 disposed in all the rows corresponding to a (2+4a)th 1P row may be performed after a process for spraying the organic material to the first pixels PX1 disposed in all the rows corresponding to a (1+4a)th 1P row is performed, and then a process for spraying the organic material to the first pixels PX1 disposed in all the rows corresponding to a (3+4a)th 1P row may be performed, and then a process for spraying the organic material to the first pixels PX1 disposed in all the rows corresponding to a (4+4a)th 1P row may be performed.

Figure 2B:
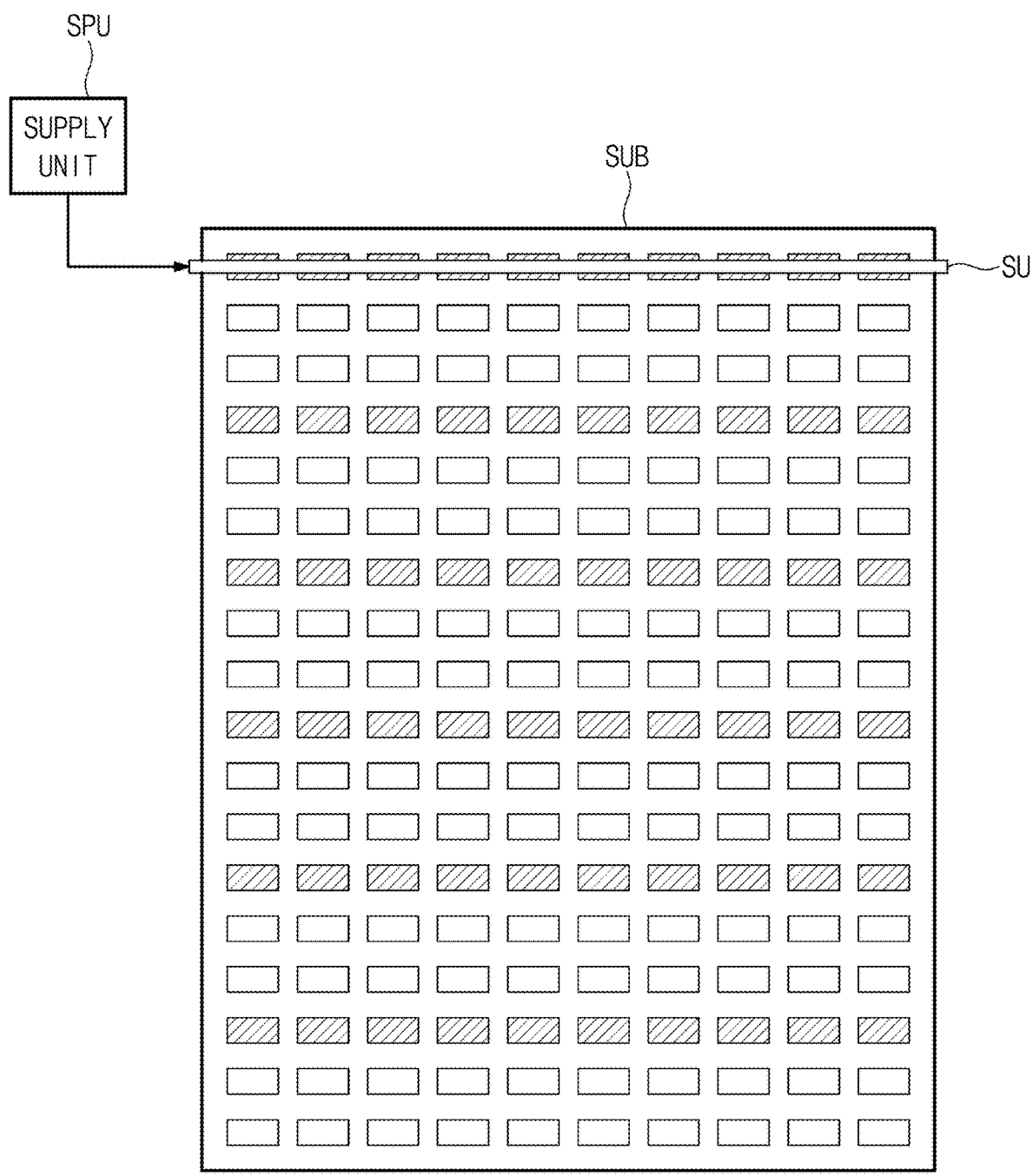
FIGS. 2B to 2G are plan views of an embodiment of an inkjet spraying device according to the invention.
Figure 2C:
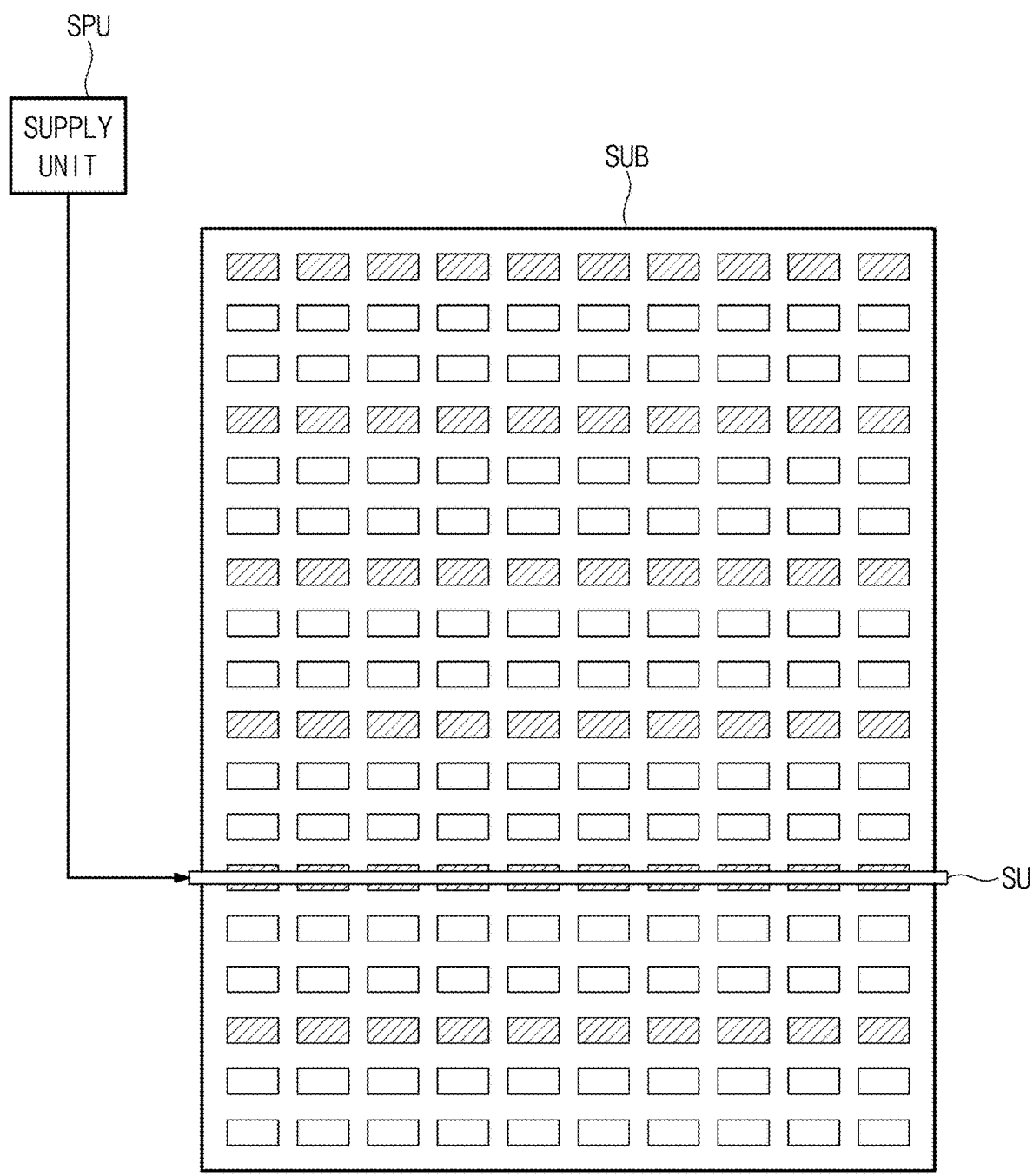
Figure 2D:
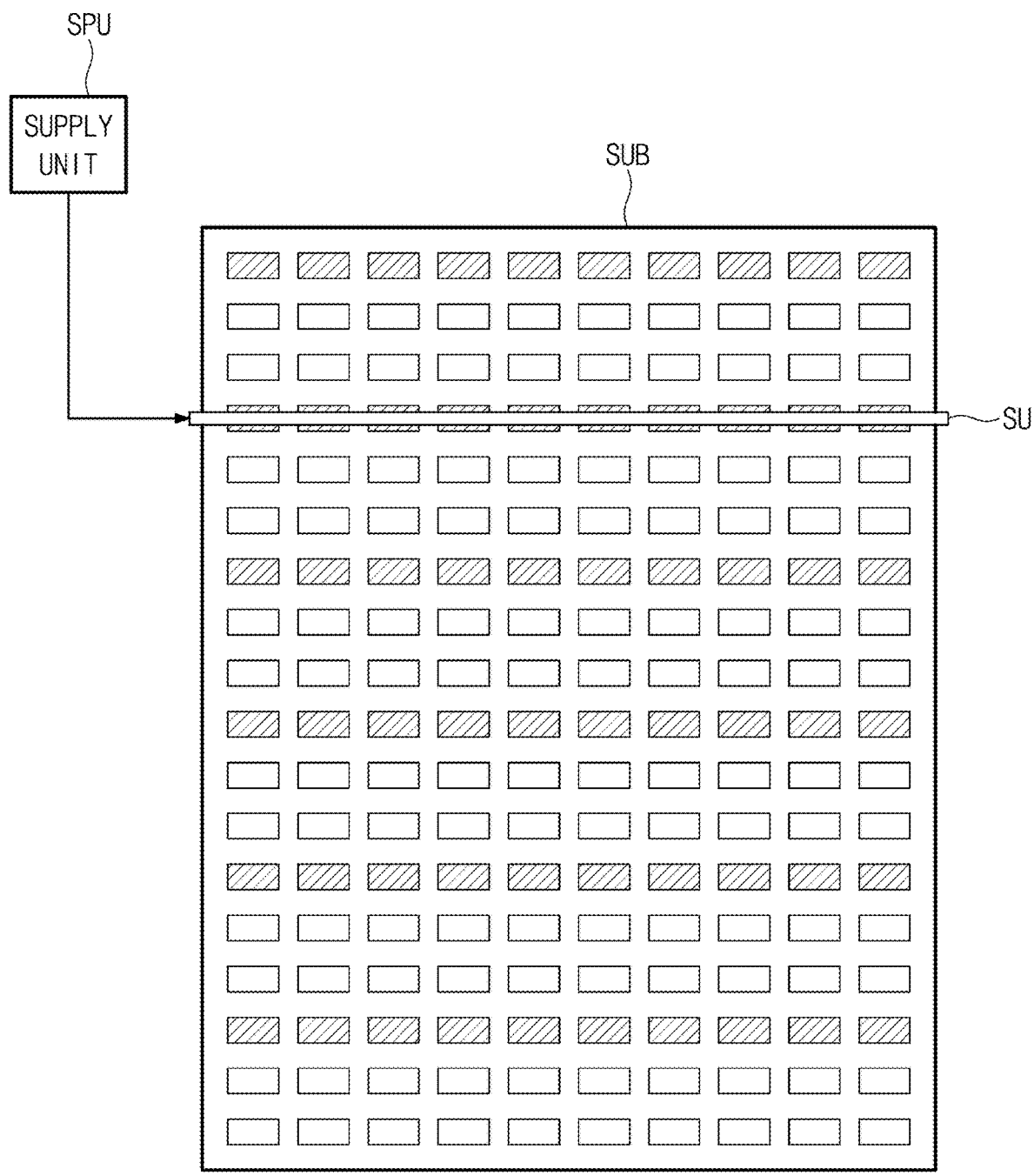
Figure 2E:
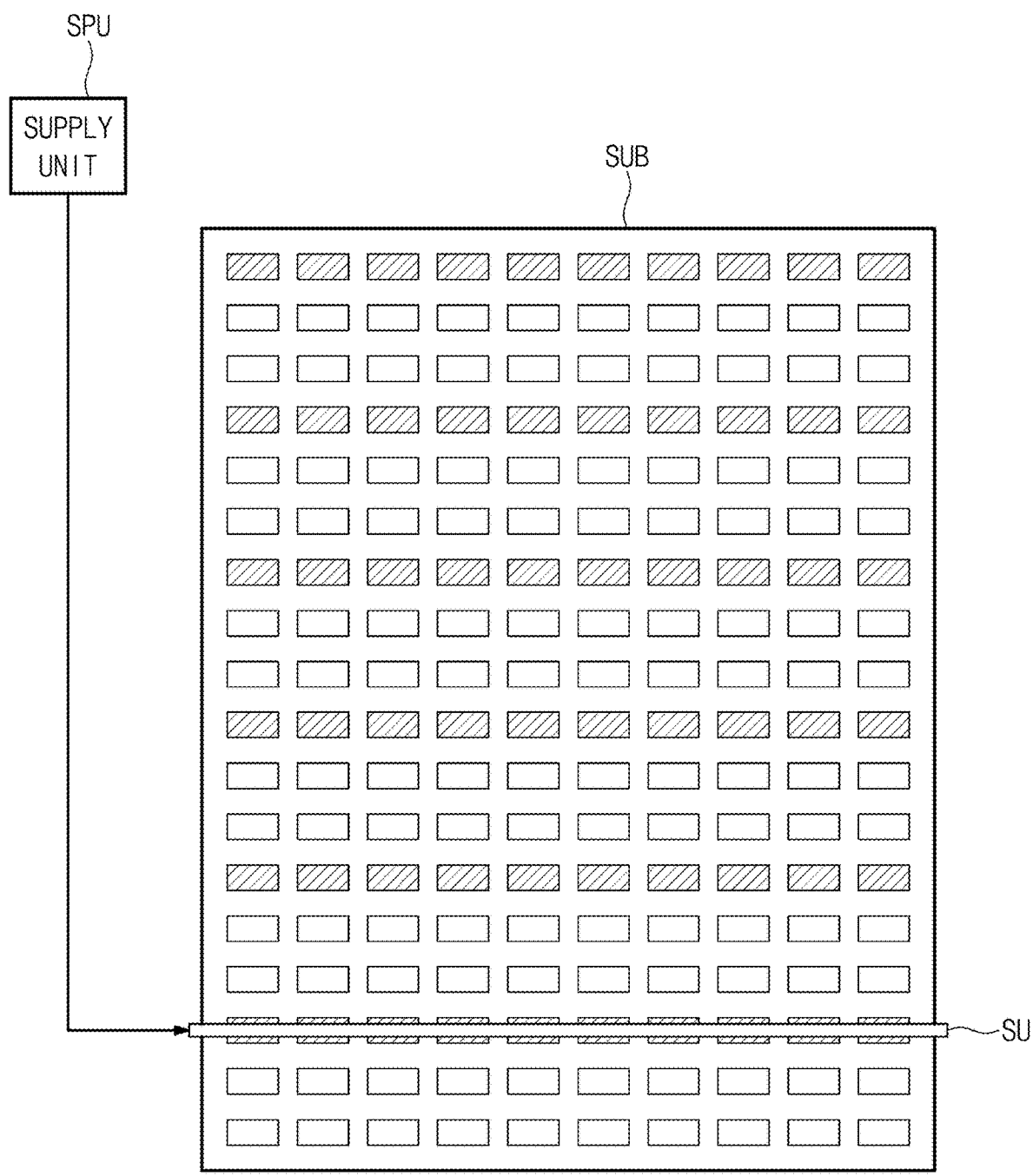
Figure 2F:
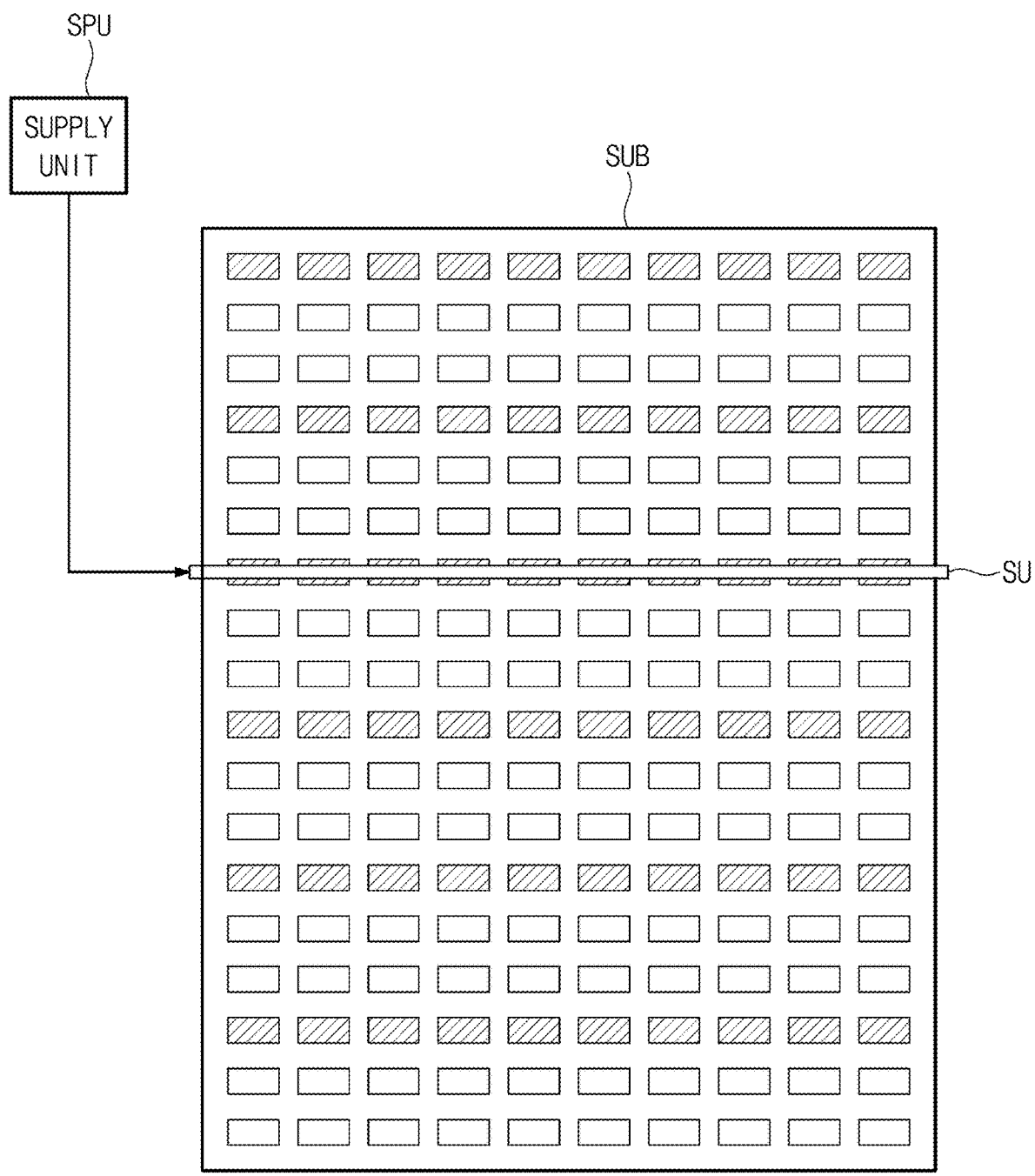
Figure 2G:
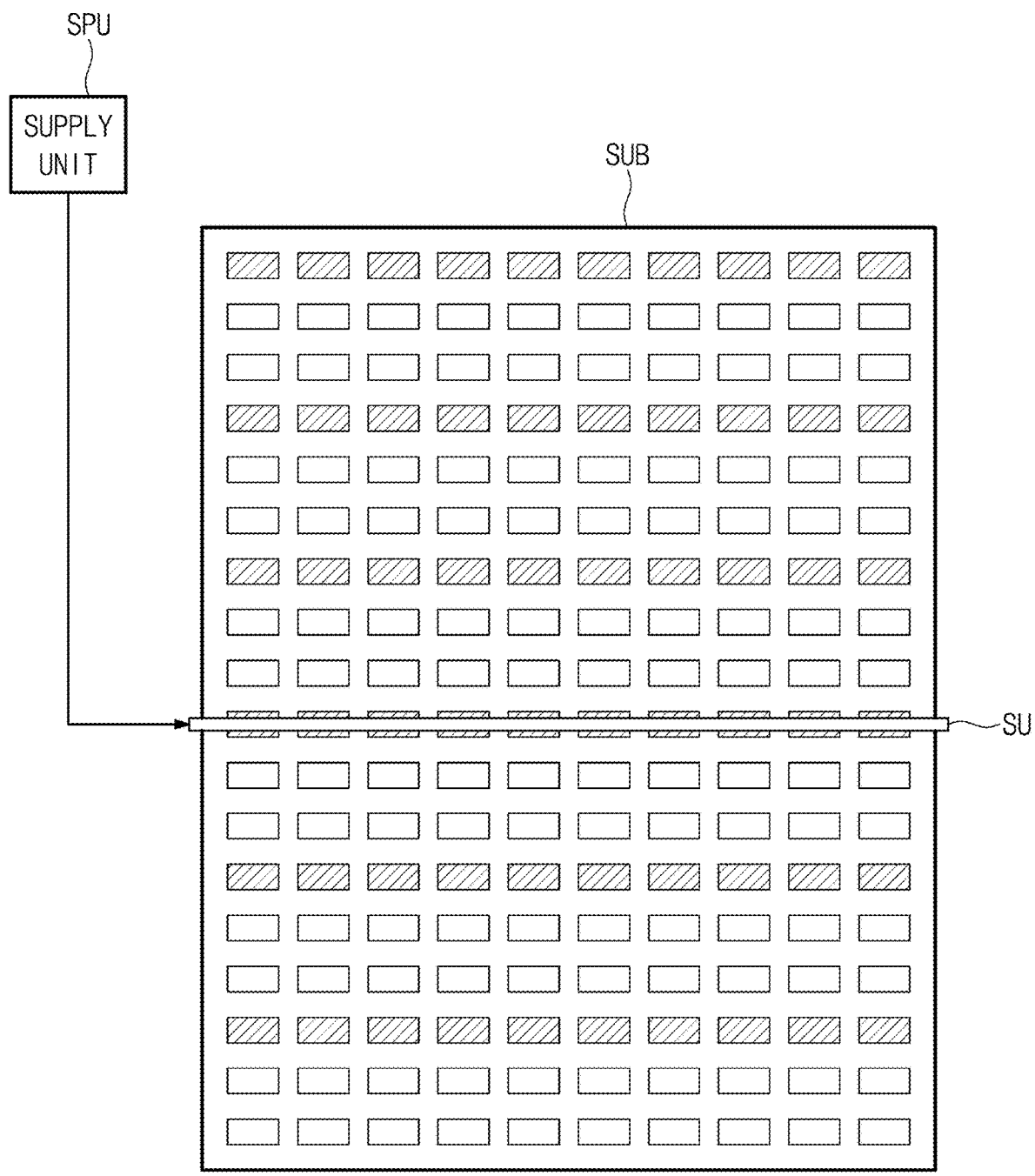
Figure 2H:
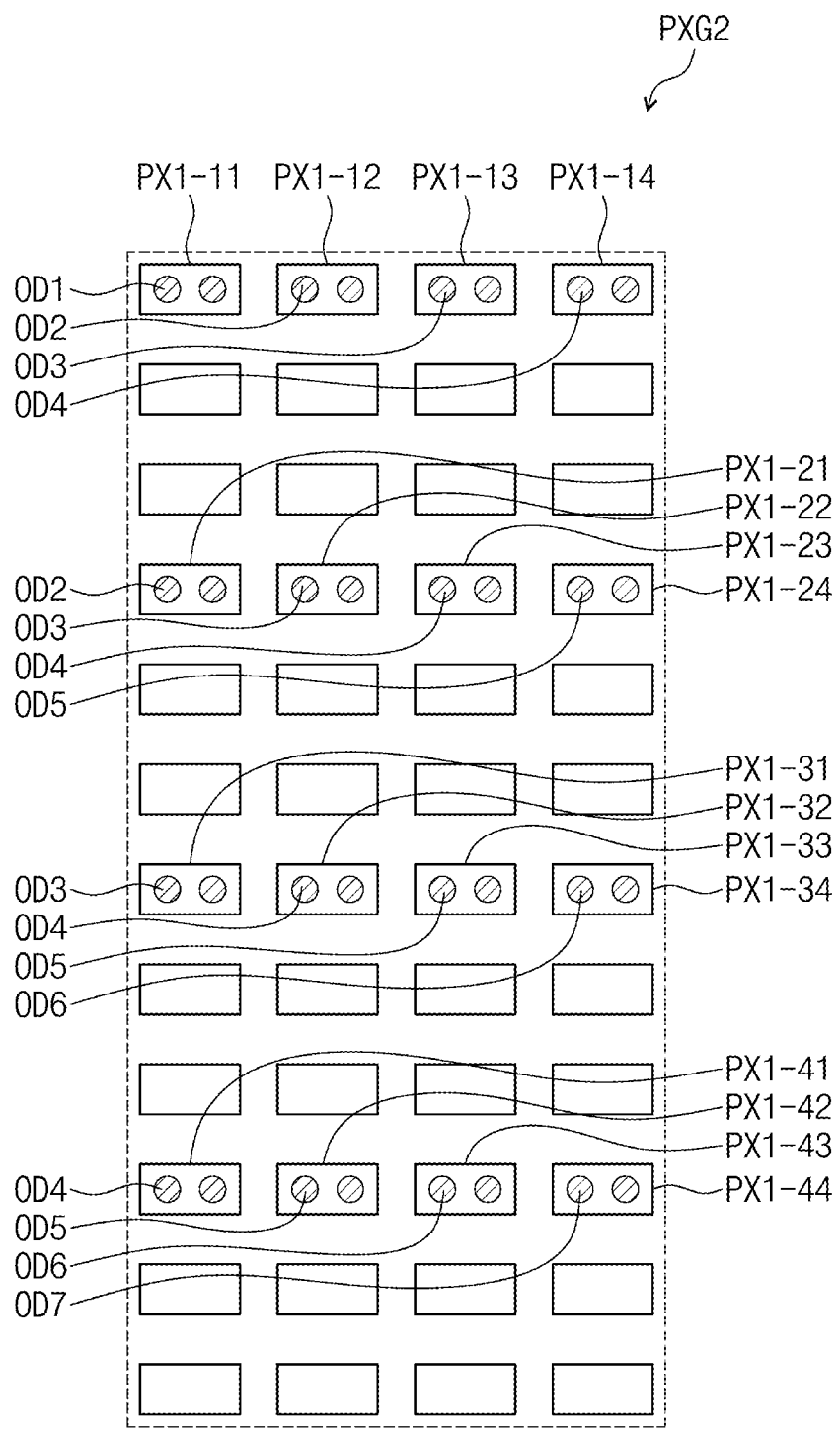
FIG. 2H is a plan view of an embodiment of a portion of a target substrate on which an organic layer is formed according to an inkjet spraying method according to the invention.

In more detail, in the spraying of the organic material to the plurality of first pixels PX1, the spraying unit SU may spray the organic material in the first 1P row PXL1-1 as in FIG. 2B, and the organic material may be sprayed in a fifth 1P row PXL1-5 as in FIG. 2C. Although not shown, after the organic material is sprayed in the fifth 1P row PXL1-5, the organic material may be sequentially sprayed in the (1+4a)th 1P rows such as a ninth 1P row, a 13th 1P row, and a 17th 1P row. After the process for spraying the organic material in the (1+4a)th 1P rows is completed, the spraying unit SU may return to a starting point and spray the organic material in the second 1P row PXL1-2 as in FIG. 2D, and may spray the organic material in a sixth 1P row PXL1-6 as in FIG. 2E. Although not shown, after the organic material is sprayed in the sixth 1P row PXL1-6, the organic material may be sequentially sprayed in the (2+4a)th 1P rows such as a tenth 1P row, a 14th 1P row, and a 18th 1P row. After the process for spraying the organic material in the (2+4a)th 1P rows is completed, the spraying unit SU may return to a starting point and spray the organic material in the third 1P row PXL1-3 as in FIG. 2F, and may sequentially spray the organic material in the (3+4a)th 1P row such as a seventh 1P row, a 11th 1P row, a 15th 1P row, and a 19th 1P row. After the process for spraying the organic material in the (3+4a)th 1P rows is completed, the spraying unit SU may return to a starting point and spray the organic material in the fourth 1P row PXL1-4 as in FIG. 2G, and may sequentially spray the organic material in the (4+4a)th 1P row such as an eighth 1P row, a 12th 1P row, a 16th 1P row, and a 20th 1P row.

Each of the plurality of nozzles included in each spraying unit SU may spray the organic material to the corresponding first pixel PX1 of the plurality of first pixels PX1 included in any one row of the plurality of rows. The inkjet spraying method in an embodiment of the invention may further include shifting the spraying unit SU along the first direction DR1 that is a row direction after the spraying of the organic material to each of the first pixels of the (1+a×n)th 1P row in the plurality of first pixels and before performing the spraying of the organic material to each of the first pixels of the (2+a×n)th 1P row in the plurality of first pixels. In addition, when n is an integer of 4 or more, shifting the spraying unit SU along the first direction DR1 that is a row direction may be further included after the spraying of the organic material to each of the first pixels of the (2+a×n)th 1P row in the plurality of first pixels and before the spraying of the organic material to each of the first pixels of the (3+a×n)th 1P row in the plurality of first pixels. Shifting the spraying unit SU along the first direction DR1 that is a row direction may be further included after the spraying of the organic material to each of the first pixels of the (3+a×n)th 1P row in the plurality of first pixels and before the spraying of the organic material to each of the first pixels of the (4+a×n)th 1P row in the plurality of first pixels. Thus, the nozzle which sprays the organic material to a first reference pixel in the first pixels of the (1+a×n)th 1P row, the nozzle which sprays the organic material to a second reference pixel which is disposed in the column direction in parallel with the first reference pixel in the first pixels of the (2+a×n)th 1P row, the nozzle which sprays the organic material to a third reference pixel which is disposed in the column direction in parallel with the first reference pixel and the second reference pixel in the first pixels of the (3+a×n)th 1P row, and the nozzle which sprays the organic material to a fourth reference pixel which is disposed in the column direction in parallel with the first reference pixel, the second reference pixel, and the third reference pixel in the first pixels of the (4+a×n)th 1P row may all be different.

As shown in FIGS. 2A to 2H, when n is 4, first organic material drops OD1 derived from a first nozzle are sprayed to a first 1P row-first unit pixel PX1-11 that is the first reference pixel in the first pixels of the first 1P row PXL1-1 that is the (1+4a)th 1P row, and second organic material drops OD2 derived from a second nozzle are sprayed to a second 1P row-first unit pixel PX1-21 that is the second reference pixel disposed in the same column as the first reference pixel in the first pixels of the second 1P row PXL1-2 that is the (2+4a)th 1P row. In addition, third organic material drops OD3 derived from a third nozzle are sprayed to a third 1P row-first unit pixel PX1-31 that is the third reference pixel disposed in the column direction in parallel with the first reference pixel and the second reference pixel in the first pixels of the third 1P row PXL1-3 that is the (3+4a)th 1P row, and fourth organic material drops OD4 derived from a fourth nozzle are sprayed to a fourth 1P row-first unit pixel PX1-41 that is the fourth reference pixel disposed in the column direction in parallel with the first reference pixel to the third reference pixel in the first pixels of the fourth 1P row PXL1-4 that is the (4+4a)th 1P row.

FIGS. 2A to 2H illustrate that the spraying unit SU is shifted in a one-pixel distance along the first direction DR1 between the spraying of the organic material to each of the first pixels of the (1+a×n)th 1P row, the (2+a×n)th 1P row, the (3+a×n)th 1P row, and the (4+a×n)th 1P row. In other words, it is illustrated that the second organic material drops OD2 derived from the second nozzle NZ2 are sprayed to a first 1P row-second unit pixel PX1-12 and the second 1P row-first unit pixel PX1-21, the third organic material drops OD3 derived from the third nozzle NZ3 are sprayed to a second 1P row-second unit pixel PX1-22 and the third 1P row-first unit pixel PX1-31, and the fourth organic material drops OD4 derived from the fourth nozzle are sprayed to a third 1P row-second unit pixel PX1-32 and the fourth 1P row-first unit pixel PX1-41. However, the invention is not limited thereto, and the distance in which the spraying unit SU is shifted along the first direction DR1 may be variously selected. In addition, the distance in which the spraying unit SU is shifted may be different in each step, for example, the spraying unit SU is shifted in a one-pixel distance after the spraying of the organic material to the (1+a×n)th 1P row and before the spraying of the organic material to the (2+a×n)th 1P row, and the spraying unit SU is shifted in at least two-pixel distance after the spraying of the organic material to the (2+a×n)th 1P row and before the spraying of the organic material to the (3+a×n)th 1P row. In an embodiment, the spraying unit SU may be shifted in a two-pixel distance after the spraying of the organic material in the (1+a×n)th 1P row and before the spraying of the organic material in the (2+a×n)th 1P row, the spraying unit SU may be shifted in a five-pixel distance after the spraying of the organic material in the (2+a×n)th 1P row and before the spraying of the organic material in the (3+a×n)th 1P row, and the spraying unit SU may be shifted in the two-pixel distance again after the spraying of the organic material in the (3+a×n)th 1P row and before the spraying of the organic material in the (4+a×n)th 1P row, for example.

In one 1P group PXG2, the first organic material drops OD1 derived from the first nozzle may be sprayed to the first 1P row-first unit pixel PX1-11, the second organic material drops OD2 derived from the second nozzle may be sprayed to the first 1P row-second unit pixel PX1-12 and the second 1P row-first unit pixel PX1-21, the third organic material drops OD3 derived from the third nozzle may be sprayed to a first 1P row-third unit pixel PX1-13, the second 1P row-second unit pixel PX1-22, and the third 1P row-first unit pixel PX1-31, the fourth organic material drops OD4 derived from the fourth nozzle may be sprayed to a first 1P row-fourth unit pixel PX1-14, a second 1P row-third unit pixel PX1-23, a third 1P row-second unit pixel PX1-32, and the fourth 1P row-first unit pixel PX1-41, fifth organic material drops OD5 derived from a fifth nozzle may be sprayed to a second 1P row-fourth unit pixel PX1-24, a third 1P row-third unit pixel PX1-33, and a fourth 1P row-second unit pixel PX1-42, sixth organic material drops OD6 derived from a sixth nozzle may be sprayed to a third 1P row-fourth unit pixel PX1-34 and a fourth 1P row-third unit pixel PX1-43, and seventh organic material drops OD7 derived from a seventh nozzle may be sprayed to a fourth 1P row-fourth unit pixel PX1-44. That is, unit pixels included in one 1P group PXG2 may include the organic material drops derived from a total of seven nozzles. However, the invention is not limited thereto, and when the distance in which the spraying unit SU is shifted is a two-pixel distance or more, the unit pixels included in one 1P group PXG2 may include the organic material drops derived from a total of 8 to 16 nozzles. The unit pixels included in one 1P group PXG2 may include the organic material drops derived from a total of n to n×n nozzles (exclusive of n). The sizes of the plurality of organic material drops OD1, OD2, OD3, OD4, OD5, OD6 and OD7 are the same as a process design, but a distribution may occur due to the difference of the nozzles. In an alternative embodiment, the sizes of the plurality of organic material drops OD1, OD2, OD3, OD4, OD5, OD6 and OD7 may be differently adjusted so that the total spraying amount of the organic material drops to be provided to each 1P group PXG2 may be the same.

As shown in FIGS. 2A to 2H, in the inkjet spraying device and the inkjet spraying method in an embodiment of the invention, two organic material drops are sprayed in each first pixel to reduce the film uniformity of the organic layer due to the distribution of each of the organic material drops, but a total of 32 organic material drops is sprayed and mixed in the pixel group unit including 16 pixel units, the organic material drops are provided through the plurality of spraying nozzles, i.e., four or more spraying nozzles, included in the spraying unit in the pixel group unit, and thus the film uniformity of the organic layer formed by mixing the organic material drops in the pixel group unit may be improved and stains that are visible from the outside may be reduced.

Figure 3A:
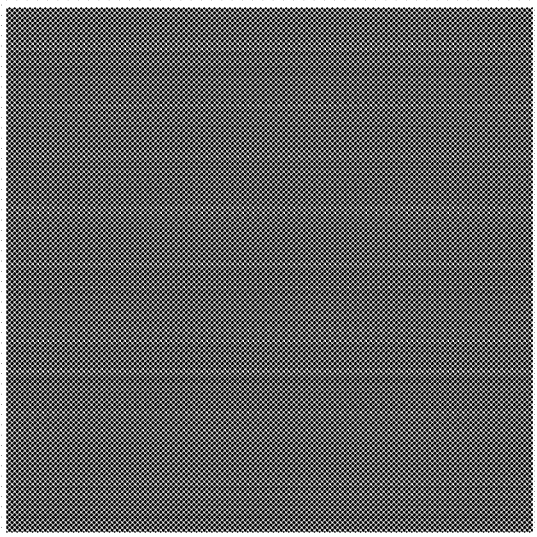
FIGS. 3A to 3D illustrate captured images of an embodiment of thin films formed by inkjet spraying methods according to the invention and comparative examples.
Figure 3B:
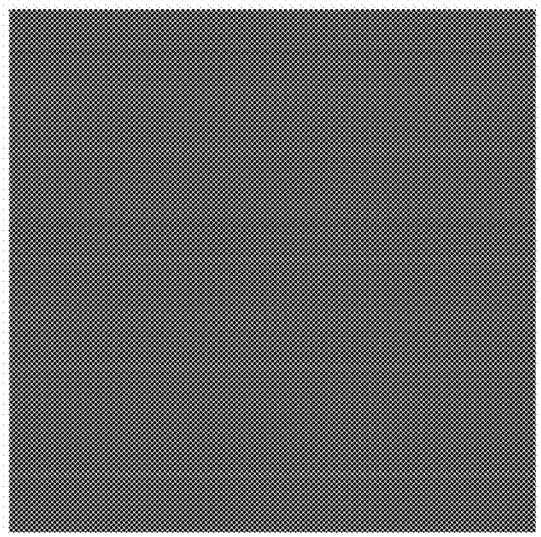
Figure 3C:
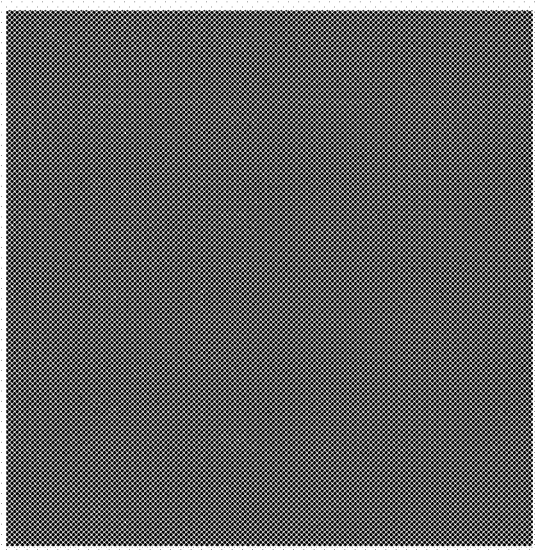
Figure 3D:
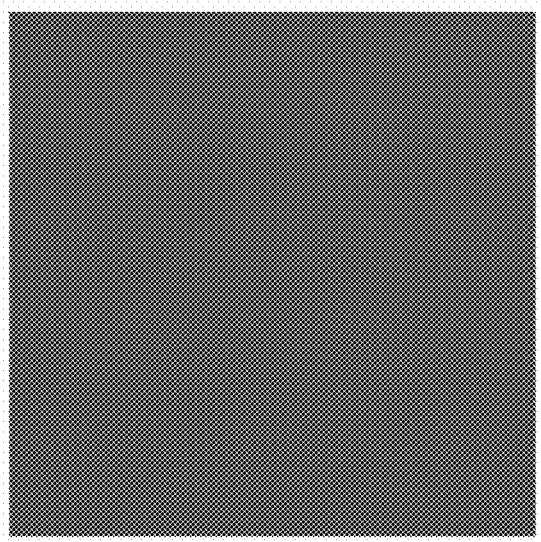

FIGS. 3A to 3D illustrate captured images of thin films formed by inkjet spraying methods in an embodiment of the invention and comparative examples. In FIGS. 3A to 3D, each thin film formed a thin film applied to a pixel density of 200 pixels per inch (ppi). FIGS. 3A and 3B are captured images of comparative examples in which a thin film was formed by spraying an organic material in each pixel row without a process for shifting the spraying unit. In FIG. 3A, one organic material drop was provided to one pixel, and in FIG. 3B, five organic material drops were provided to one pixel. FIG. 3C is a captured image of an example, in the inkjet spraying method of an embodiment, in which n is 4, and the process for shifting the spraying unit is added between each of the spraying process of the organic material in the (1+4a)th 1P row, the spraying process of the organic material in the (2+4a)th 1P row, the spraying process of the organic material in the (3+4a)th 1P row, and the spraying process of the organic material in the (4+4a)th 1P row. In FIG. 3C, five organic material drops were provided to one pixel. FIG. 3D is a captured image of a reference example in which a thin film was formed by spraying the organic material in each pixel row through the spraying unit without the process for shifting the spraying unit. In FIG. 3D, seven organic material drops were provided to one pixel.

Referring to FIGS. 3C and 3D, compared with the comparative example of FIG. 3A and the comparative example of FIG. 3B, when a thin film is formed by the inkjet spraying method in an embodiment of the invention, it may be seen that stains which appear as horizontal stripes in the thin film are reduced. In particular, even when comparing the comparative example of FIG. 3B and the example of FIG. 3C, in which five organic material drops were provided to one pixel, it may be seen that stains which appear in the thin film are also reduced in the example of FIG. 3C. In addition, even compared with the reference example of FIG. 3D in which seven organic material drops are provided in one pixel, it may be seen that stains which appear in the thin film are also reduced in the example of FIG. 3C. Thus, the inkjet spraying method in an embodiment of the invention includes the shift process of the spraying unit, thereby performing the inkjet process for spraying the organic material to the pixel group unit through more nozzles in the pixel group unit including a plurality of pixel units, and thus it may be seen that the film uniformity of the organic layer in the pixel group unit may be improved and stains that are visible from the outside may be reduced.

Figure 4:
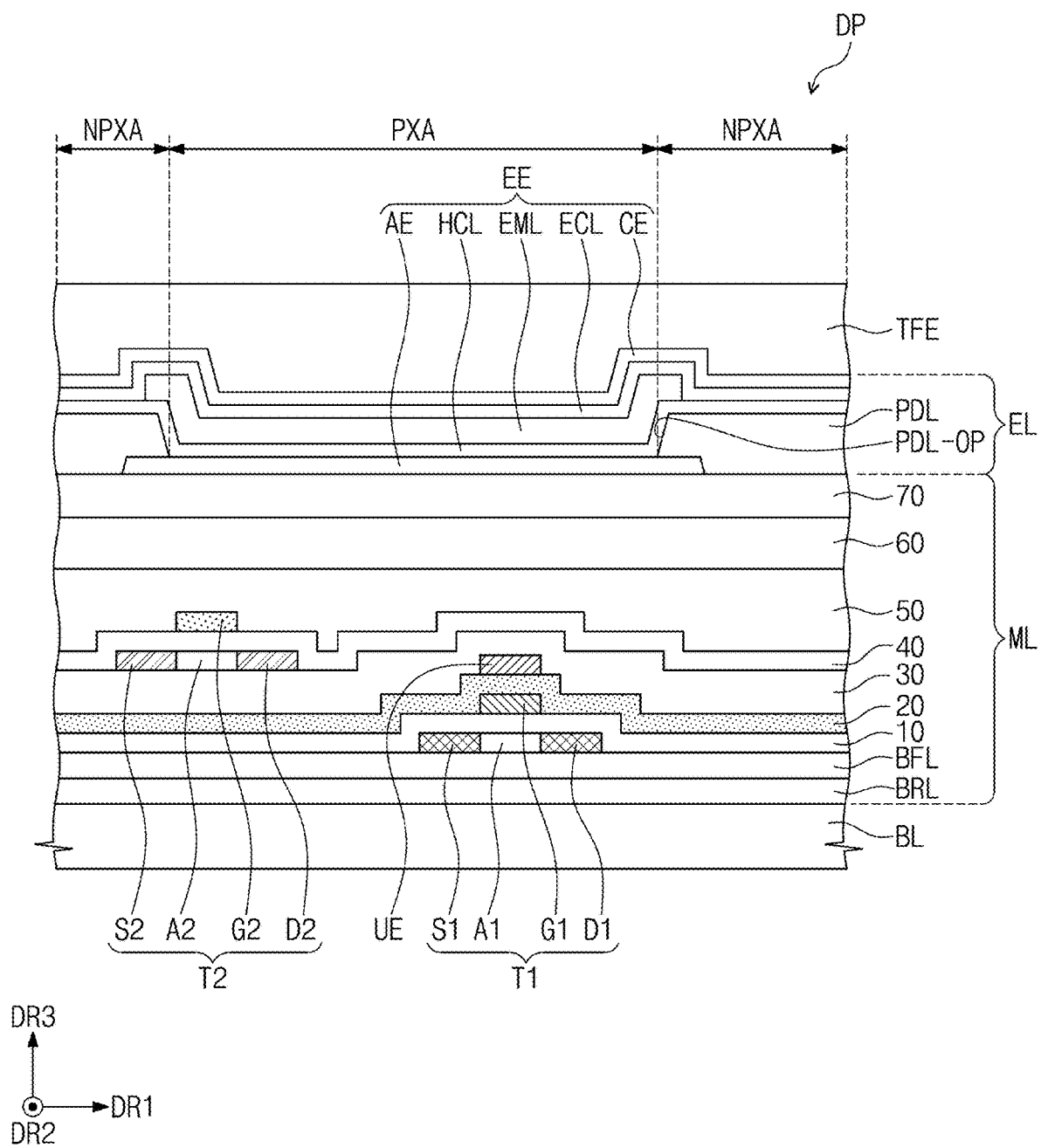
FIG. 4 is a cross-sectional view of an embodiment of a display panel according to the invention.

FIG. 4 is a cross-sectional view of an embodiment of a display panel according to the invention. In an embodiment of the display panel shown in FIG. 4, at least a portion of configurations may be formed through the inkjet spraying device and the inkjet spraying method according to the invention.

Referring to FIG. 4, in an embodiment of the invention, the display panel DP may be a light emitting display panel. FIG. 4 illustrates a cross-section corresponding to one of the plurality of pixels, and the cross-section corresponding to two transistors T1 and T2 and a light emitting element EE. As shown in FIG. 4, the display panel DP includes a base layer BL, a circuit element layer ML disposed on the base layer BL, a display element layer EL disposed on the circuit element layer ML, and an insulation layer TFE (hereinafter, also referred to as an upper part insulation layer) disposed on the display element layer EL.

The base layer BL may include a synthetic resin layer. The base layer BL may be formed by forming the synthetic resin layer on a support substrate, which is used to manufacture the display panel DP, forming a conductive layer, an insulation layer, etc., on the synthetic resin layer, and then removing the support substrate.

The circuit element layer ML includes at least one insulation layer and circuit element. The circuit element includes a signal line, a pixel driving circuit, etc. The circuit element layer ML may be formed through a forming process of an insulation layer, a semiconductor layer, and a conductive layer by coating, deposition, etc., and a patterning process of the insulation layer, the semiconductor layer, and the conductive layer by a photolithography process.

In the illustrated embodiment, the circuit element layer ML includes a buffer layer BFL, a barrier layer BRL, and a first to seventh insulation layers 10, 20, 30, 40, 50, 60, and 70. The buffer layer BFL, the barrier layer BRL, and the first to seventh insulation layers 10, 20, 30, 40, 50, 60, and 70 may include any one among an inorganic film and an organic film. The buffer layer BFL and the barrier layer BRL may include the inorganic film. At least one among the fifth to seventh insulation layers 50, 60 and 70 may include the organic film.

FIG. 4 illustrates arrangement relationship of a first active A1, a second active A2, a first gate G1, a second gate G2, a first source S1, a second source S2, a first drain D1, a second drain D2, which constitute the first and second transistors T1 and T2. In the illustrated embodiment, the first active A1 and the second active A2 may include different materials. The first active A1 may include a polysilicon semiconductor, and the second active A2 may include a metal oxide semiconductor. The first source S1 and the first drain D1 are regions having higher doping concentration than the first active A1, and have a function of an electrode. The second source S2 and the second drain D2 are regions in which the metal oxide semiconductor is reduced, and have the function of the electrode. In an embodiment, an upper electrode UE may be disposed on the second insulation layer 20 and overlap the first gate G1.

In an embodiment of the invention, the first active A1 and the second active A2 may include the same semiconductor material, and in this case, a stacked structure of the circuit element layer ML may become simpler.

The display element layer EL includes a pixel defining film PDL and the light emitting element EE. The light emitting element EE may be an organic light emitting diode or a quantum dot light emitting diode. An anode AE is disposed on the seventh insulation layer 70. A pixel opening PDL-OP of the pixel defining film PDL expose at least a portion of the anode AE. The pixel opening PDL-OP of the pixel defining film PDL may define a light emitting area PXA. Non-light emitting areas NPXA may surround the light emitting area PXA.

A hole control layer HCL and an electron control layer ECL may be commonly disposed in the light emitting area PXA and the non-light emitting areas NPXA. An emission layer EML may include a luminous material, and be provided in a pattern form to correspond to the pixel opening PDL-OP. The emission layer EML may be deposited in a different method compared to the hole control layer and the electron control layer ECL which are in a film form. The hole control layer HCL and the electron control layer ECL may be commonly formed in a plurality of pixels using an open mask. The emission layer EML may be formed in a pattern form to correspond to the pixel opening PDL-OP by the inkjet spraying device and the inkjet spraying method according to the invention. That is, the pixel defining film PDL shown in FIG. 4 may correspond to the partition wall BK shown in FIGS. 1F to 1I, and the emission layer EML may correspond to the organic material OM pattern formed in an opening of the partition wall BK. However, the invention is not limited thereto, the hole control layer HCL and the electron control layer ECL may also be formed in a pattern form to correspond to the pixel opening PDL-OP as the emission layer EML by the inkjet spraying device and the inkjet spraying method according to the invention. In addition, although not shown, a color filter layer, a light control layer, and the like disposed on the display element layer EL may be formed through the inkjet spraying device and the inkjet spraying method according to the invention.

A cathode CE is disposed on the electron control layer ECL. The upper part insulation layer TFE is disposed on the cathode CE. The upper part insulation layer TFE may be a thin film encapsulation layer in order to encapsulate the display element layer EL. The upper part insulation layer TFE may include a plurality of thin films. The plurality of thin films may include an inorganic film and an organic film. The upper part insulation layer TFE may include an insulation layer to encapsulate the display element layer EL and a plurality of insulation layers to improve light outgoing efficiency.

In an embodiment, film uniformity of an organic layer to be formed by performing an inkjet process in a pixel group unit may be improved while an inkjet spraying device and an inkjet spraying method are utilized in a high resolution display panel manufacturing process having decreased size of each pixel. Accordingly, a high resolution display panel having improved display quality may be manufactured when manufacturing a display panel by utilizing the inkjet spraying device and the inkjet spraying method according to the invention.

Although the invention has been described with reference to a preferred embodiment of the invention, it will be understood that the invention should not be limited to these preferred embodiments but various changes and modifications may be made by those skilled in the art without departing from the spirit and scope of the invention.

Accordingly, the technical scope of the invention is not intended to be limited to the contents set forth in the detailed description of the specification, but is intended to be defined by the appended claims.

What is claimed is:

1. An inkjet spraying method comprising:
    preparing a spraying unit including a plurality of nozzles for spraying an organic material on a target substrate including a plurality of first pixels which display a same color;
    spraying the organic material to each of first pixels of a (1+a×n)th first-pixel row in the plurality of first pixels; and
    spraying the organic material to each of first pixels of a (2+a×n)th first-pixel row in the plurality of first pixels,
    wherein a first nozzle in the plurality of nozzles sprays the organic material to a first reference pixel in the first pixels of the (1+a×n)th first-pixel row,
    a second nozzle, which is different from the first nozzle, in the plurality of nozzles sprays the organic material to a second reference pixel in the first pixels of the (2+a×n)th first-pixel row,
    the second reference pixel is disposed in parallel with the first reference pixel in a first direction,
    n is an integer of 2 or more, and
    a is an integer of 0 or more.

2. The inkjet spraying method of claim 1, further comprising shifting the spraying unit along a second direction of the plurality of first pixels which crosses the first direction after the spraying the organic material to each of the first pixels of the (1+a×n)th first-pixel row in the plurality of first pixels and before the spraying the organic material to each of the first pixels of the (2+a×n)th first-pixel row in the plurality of first pixels.

3. The inkjet spraying method of claim 1, wherein the spraying the organic material to each of the first pixels of the (2+a×n)th first-pixel row is carried out after the spraying the organic material to each of the first pixels of the (1+a×n)th first-pixel row.

4. The inkjet spraying method of claim 1, wherein the spraying the organic material to each of the first pixels of the (1+a×n)th first-pixel row in the plurality of first pixels comprises:
    spraying the organic material to each of first pixels of a first first-pixel row in the plurality of first pixels; and
    spraying the organic material to each of first pixels of a (1+n)th first-pixel row in the plurality of first pixels,
    wherein the first nozzle sprays the organic material to a first reference pixel in the first pixels of the first first-pixel row, and
    the first nozzle sprays the organic material to a first reference pixel in first pixels of a (1+n)th first-pixel row disposed in parallel with the first reference pixel in the first pixels of the first first-pixel row in the first direction.

5. The inkjet spraying method of claim 1, wherein the spraying the organic material to each of the first pixels of the (2+a×n)th first-pixel row in the plurality of first pixels comprises:
    spraying the organic material to each of first pixels of a second first-pixel row in the plurality of first pixels; and
    spraying the organic material to each of first pixels of a (2+n)th first-pixel row in the plurality of first pixels,
    wherein the second nozzle sprays the organic material to a second reference pixel in the first pixels of the second first-pixel row,
    the second nozzle sprays the organic material to a second reference pixel in first pixels of a (2+n)th first-pixel row, and
    the second reference pixel in the first pixels of the (2+n)th first-pixel row is disposed in parallel with the second reference pixel in the first pixels of the second first-pixel row.

6. The inkjet spraying method of claim 1, wherein the organic material sprayed by each of the plurality of nozzles comprises a same luminous material.

7. The inkjet spraying method of claim 1, further comprising moving the spraying unit along the first direction of the plurality of first pixels.

8. The inkjet spraying method of claim 7, wherein the spraying unit sprays the organic material to the plurality of first pixels disposed in a second direction of the plurality of first pixels which crosses the first direction while moving along the first direction of the plurality of first pixels.

9. The inkjet spraying method of claim 1, wherein the spraying unit extends in a second direction of the plurality of first pixels which crosses the first direction.

10. The inkjet spraying method of claim 1, wherein n is an integer of 4 or more, and the inkjet spraying method, after the spraying the organic material to each of the first pixels of the (2+a×n)th first-pixel row in the plurality of first pixels, further comprises:
    spraying the organic material to each of first pixels of a (3+a×n)th first-pixel row in the plurality of first pixels; and
    spraying the organic material to each of first pixels of a (4+a×n)th first-pixel row in the plurality of first pixels.

11. The inkjet spraying method of claim 10, wherein a third nozzle different from the first nozzle and the second nozzle in the plurality of nozzles sprays the organic material to a third reference pixel in the first pixels of the (3+a×n)th first-pixel row,
    the third reference pixel is disposed in parallel with the first reference pixel and the second reference pixel in the first direction,
    a fourth nozzle different from the first nozzle to the third nozzle in the plurality of nozzles sprays the organic material to a fourth reference pixel in the first pixels of the (4+a×n)th first-pixel row, and
    the fourth reference pixel is disposed in parallel with the first reference pixel to the third reference pixel in the first direction.

12. The inkjet spraying method of claim 1, wherein the target substrate further comprises:
    a plurality of second pixels arranged in a second direction which crosses the first direction; and
    a plurality of third pixels arranged in the second direction.

13. The inkjet spraying method of claim 1, wherein, in the spraying the organic material, one to nine organic material drops are sprayed to each of the plurality of first pixels.

14. An inkjet spraying device comprising a spraying unit including a plurality of nozzles which spray an organic material on a target substrate including a plurality of first pixels which display a same color,
  wherein the plurality of nozzles comprises:
    a first nozzle which sprays the organic material to a first reference pixel in first pixels disposed in a (1+a×n)th first-pixel row in the plurality of first pixels; and
    a second nozzle which sprays the organic material to a second reference pixel in first pixels in a (2+a×n)th first-pixel row in the plurality of first pixels,
    the second reference pixel is disposed in parallel with the first reference pixel in a first direction,
    n is an integer of 2 or more, and
    a is an integer of 0 or more.

15. The inkjet spraying device of claim 14, further comprising a transfer part which moves the spraying unit along a second direction of the plurality of first pixels which crosses the first direction,
  wherein the spraying unit sprays the organic material to the plurality of first pixels disposed in the second direction while moving along the first direction.

16. A display panel manufacturing method comprising:
  preparing a target substrate including a plurality of first pixels which display a same color; and
  forming an organic layer by spraying, through a spraying unit including a plurality of nozzles, an organic material to each of the plurality of first pixels,
  wherein in the forming the organic layer, a first nozzle in the plurality of nozzles sprays the organic material to a first reference pixel in first pixels of a (1+a×n)th first-pixel row in the plurality of first pixels,
  a second nozzle, which is different from the first nozzle, in the plurality of nozzles sprays the organic material to a second reference pixel in first pixels of a (2+a×n)th first-pixel row in the plurality of first pixels,
  the second reference pixel is disposed in parallel with the first reference pixel in a first direction,
  n is an integer of 2 or more, and
  a is an integer of 0 or more.

17. The display panel manufacturing method of claim 16, wherein the second nozzle sprays the organic material to a first same row pixel disposed in a same row as the first reference pixel in the spraying the organic material to the first pixels of the (1+a×n)th first-pixel row.

18. The display panel manufacturing method of claim 16, wherein n is an integer of 4 or more,
  in the forming the organic layer, a third nozzle different from the first nozzle and the second nozzle in the plurality of nozzles sprays the organic material to a third reference pixel in first pixels of a (3+a×n)th first-pixel row in the plurality of first pixels,
  the third reference pixel is disposed in parallel with the first reference pixel and the second reference pixel in the first direction, and
  a fourth nozzle different from the first nozzle to the third nozzle in the plurality of nozzles sprays the organic material to a fourth reference pixel in first pixels of a (4+a×n)th first-pixel row in the plurality of first pixels,
  the fourth reference pixel is disposed in parallel with the first reference pixel to the third reference pixel in the first direction.

19. The display panel manufacturing method of claim 16, wherein the target substrate further comprises a pixel defining film which separates the plurality of first pixels.

20. The display panel manufacturing method of claim 16, wherein the organic material includes a luminous material, and is included in a light emitting element.

\* \* \* \* \*